(12) United States Patent
Yasuda et al.

(10) Patent No.: US 8,331,130 B2
(45) Date of Patent: Dec. 11, 2012

(54) SEMICONDUCTOR INTEGRATED CIRCUIT

(75) Inventors: Shinichi Yasuda, Kanagawa-ken (JP);
Keiko Abe, Kanagawa-ken (JP);
Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 10 days.

(21) Appl. No.: 12/880,758

(22) Filed: Sep. 13, 2010

(65) Prior Publication Data

US 2011/0205780 A1    Aug. 25, 2011

(30) Foreign Application Priority Data

Feb. 19, 2010    (JP) ................ P2010-034952

(51) Int. Cl.
*G11C 11/00* (2006.01)
(52) U.S. Cl. ................................. 365/148
(58) Field of Classification Search .......... 365/148
See application file for complete search history.

(56) References Cited

U.S. PATENT DOCUMENTS

| 6,949,435 | B2 * | 9/2005 | Hsu et al. .............. 438/286 |
| 7,274,587 | B2 | 9/2007 | Yasuda |
| 2006/0028247 | A1 * | 2/2006 | Hara et al. .............. 326/104 |
| 2007/0103192 | A1 * | 5/2007 | Madurawe .............. 326/39 |
| 2007/0146012 | A1 | 6/2007 | Murphy et al. |
| 2010/0014343 | A1 * | 1/2010 | Wei et al. .............. 365/148 |
| 2010/0073991 | A1 | 3/2010 | Yamada et al. |
| 2010/0148821 | A1 * | 6/2010 | Yu et al. .............. 326/41 |
| 2011/0001115 | A1 * | 1/2011 | Greene et al. .............. 257/4 |

FOREIGN PATENT DOCUMENTS

| JP | 2009-87494 A | 4/2009 |
| JP | 2009-94226 | 4/2009 |
| JP | 2009-151885 | 7/2009 |
| WO | WO 2009/069690 | 6/2009 |
| WO | WO 2009/104229 | 8/2009 |

OTHER PUBLICATIONS

Notification of Reason for Refusal, issued by Japanese Patent Office, dated Nov. 22, 2011, in Japanese Patent Application No. 2 010-034952 (2 pages).

* cited by examiner

*Primary Examiner* — Hoai V Ho
*Assistant Examiner* — Min Huang
(74) *Attorney, Agent, or Firm* — Finnegan, Henderson, Farabow, Garrett & Dunner, L.L.P.

(57) ABSTRACT

In one embodiment, a semiconductor integrated circuit includes a first resistive-change element, a second resistive-change element and a first switching element. The first resistive-change element includes one end having a first polarity connected to a first power source. The first resistive-change element includes another end having a second polarity connected to an output node. The second resistive-change element includes one end having the second polarity connected to the output node. The first switching element includes a first terminal connected to another end of the second resistive-change element. The first switching element includes a second terminal connected to a second power source.

18 Claims, 23 Drawing Sheets

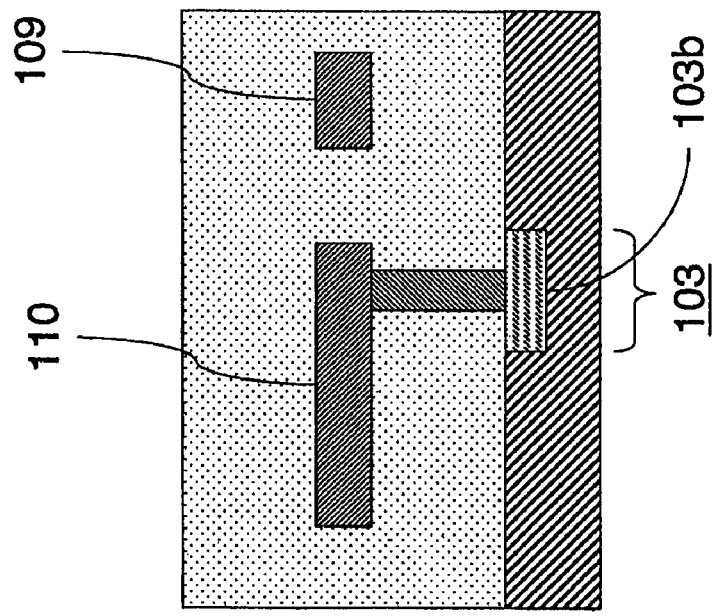
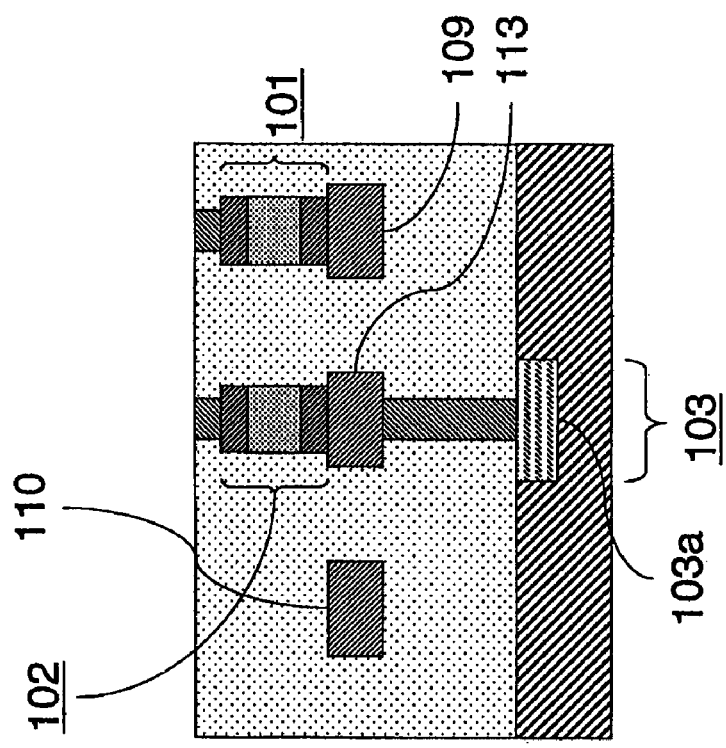
FIG.10A
FIG.10B

SEMICONDUCTOR INTEGRATED CIRCUIT

CROSS REFERENCE TO RELATED APPLICATION

This application is based upon and claims the benefit of priority from the prior Japanese Patent Application No. 2010-34952, filed on Feb. 19, 2010, the entire contents of which are incorporated herein by reference.

FIELD

Embodiments described herein relate generally to a reconfigurable semiconductor integrated circuit represented by a field programmable gate array (FPGA), and more particularly to a memory circuit to hold wiring connection information and logic information.

BACKGROUND

A fundamental construction of an FPGA is composed of a configurable logic block (CLB) to realize optional logic information, a connection block (CB) to input and output between the CLB and wiring, and a switch block (SB) to switch over the connection of the wiring. In each of the blocks, the logic information and the wiring connection information are changed by values stored in configuration memories.

Recently, several nonvolatile resistive-change memories are proposed as the configuration memory. As these are formed in a wiring layer, it is possible to reduce a silicon area compared with an SRAM. Several kinds of the resistive-change memories are proposed, a bipolar type memory to program conduction and non-conduction in a direction to apply a voltage has a merit to control easily compared with a unipolar type in that it is not necessary to control the value of the voltage more finely.

When two memory elements are arranged in series, it is necessary to insert a selecting transistor in series with the two memory elements so as to prevent the current from flowing into another memory cell.

In the method to use the bipolar type memory as the configuration memory of the FPGA, there is a problem that to provide four power source voltages is necessary. In addition, as the two memories are directly connected between the wirings, there is another problem that current happens to flow into the device which is not programmed and then false writing happens.

In a circuit constitution inserted selecting transistors in series with the two memory elements such as a magnetic tunnel junction element, for example, there is a problem that a magneto resistance ratio of conduction and non-conduction of the element is small and it is difficult to use the circuit constitution directly for the configuration memory of the FPGA. In addition, as a memory array is supposed and a plurality of the memories are connected to one bit line, there is a problem that current happens to flow into the memory element of another cell and then the operation becomes unstable.

BRIEF DESCRIPTION OF THE DRAWINGS

FIG. 7 to 11 are views showing a manufacturing process of the semiconductor integrated circuit shown in FIG. 6;

DETAILED DESCRIPTION

Figure 1:
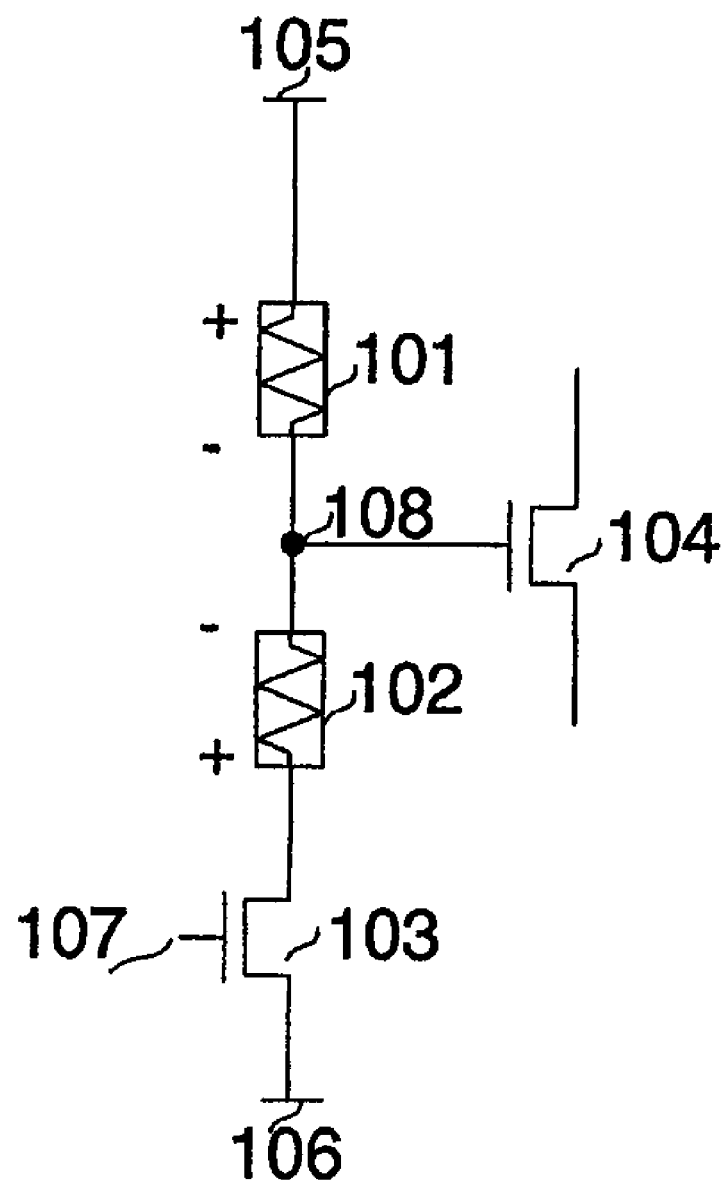
FIG. 1 is a circuit diagram of a semiconductor integrated circuit according to the first embodiment.

In one embodiment, a semiconductor integrated circuit includes a first resistive-change element, a second resistive-change element and a first switching element. The first resistive-change element includes one end having a first polarity connected to a first power source. The first resistive-change element includes another end having a second polarity connected to an output node. The second resistive-change element includes one end having the second polarity connected to the output node and another end. The first switching element includes a first terminal connected to another end of the second resistive-change element. The first switching element includes a second terminal connected to a second power source.

In another embodiment, a semiconductor integrated circuit includes a first resistive-change element, a second resistive-change element, a first switching element, a fifth switching element, a third resistive-change element, a fourth resistive-change element, a sixth switching element, a seventh switching element and a second inverting circuit. The first resistive-change element includes one end having a first polarity connected to a first power source. The first resistive-change element includes another end having a second polarity connected to a first output node. The second resistive-change element includes one end having the second polarity connected to the first output node. The first switching element includes a first terminal connected to another end of the second resistive-change element. The first switching element includes a second terminal connected to a second power source. The fifth switching element includes a first terminal connected to the first output node. The fifth switching element includes a second terminal connected to an output terminal. The third resistive-change element includes one end having the first polarity connected to a third power source. The third resistive-change element includes another end having the second polarity connected to a second output node. The fourth resistive-change element includes one end having a second polarity connected to the second output node. The sixth switching element includes a first terminal connected to another end of the fourth resistive-change element. The sixth switching element includes a second terminal connected to a fourth power source. The seventh switching element includes a first terminal connected to the second output node. The seventh switching element includes a second terminal connected to the output terminal. The second inverting circuit is connected to a control terminal of the fifth switching element and a control terminal of the seventh switching element.

Further, multiple embodiments will be hereinafter described with reference to the drawings. In the drawings, the same reference numerals denote the same or similar portions.

The first embodiment will be explained with reference to FIG. 1. FIG. 1 is a circuit diagram showing a fundamental construction of a semiconductor integrated circuit of the first embodiment. In the drawing, a first resistive-change element 101 and a second resistive-change element 102 indicate a bipolar type resistive-change memory, and + and − indicate a polarity. For example, in case that a programming voltage is applied in a direction from + to −, the memory is programmed in a low resistance state, and in case that a programming voltage is applied in a direction from − to +, the memory is programmed in a high resistance state. In the following description, it is assumed that the first resistive-change element 101 and the second resistive-change element 102 are of the above-described polarity.

In the fundamental construction of FIG. 1, the first resistive-change element 101, the second resistive-change element 102 and a first switching element 103 are connected in series between a first power source 105 and a second power source 106. In addition, a gate electrode of a second switching element 104 is connected to an output (connection) node 108 of the first resistive-change element 101 and the second resistive-change element 102. The second switching element 104 is used as a switch to change over the wiring in an FPGA. In FIG. 1, the first switching element 103 and the second switching element 104 are shown both as N channel IGFETs (insulated gate field effect transistors), but without being limited to this, P channel IGFETs or micro-electro-mechanical switches may be used. Here, it is thought that the first resistive-change element 101, the second resistive-change element 102 and the first switching element 103 compose a memory cell of a resistive-change memory. An IGFET is also called a MOSFET (metal insulated semiconductor field effect transistor) or a MISFET (metal oxide semiconductor field effect transistor).

Resistance states of the first resistive-change element 101 and the second resistive-change element 102 are mutually programmed in a complementary manner in a steady state. That is, they are programmed such that if the first resistive-change element 101 is in the high resistance state, the second resistive-change element 102 is in the low resistance state (called as a state 1), and if the first resistive-change element 101 is in the low resistance state, the second resistive-change element 102 is in the high resistance state (called as a state 2). For the reason, the first resistive-change element 101 and the second resistive-change element 102 are connected so that the polarities become mutually reverse in a direction from the first power source 105 to the second power source 106. For the reason, it is necessary that the first resistive-change element 101 and the second resistive-change element 102 are bipolar type memories. In addition, the directions of the polarities are not limited to the combination of the directions in FIG. 1, but they may be connected such that the polarity of the first resistive-change element 101 becomes − + and the polarity of the second resistive-change element 102 becomes + − in the direction from the first power source 105 to the second power source 106, for example.

In the case of operating the FPGA, the FPGA is operated in the state that the first switching element 103 is made conducting and a voltage is applied between the first power source 105 and the second power source 106. For example, when a higher voltage source voltage $V_{dd}$ is given to the first power source 105 and a lower voltage source voltage $V_{ss}$ is given to the second power source 106, at the output node 108, in the case of the state 1 a voltage near the lower voltage source voltage $V_{ss}$ appears and in the case of the state 2 a voltage near the higher voltage source voltage $V_{dd}$ appears, respectively. The conduction and non-conduction of the second switching element 104 is controlled by the voltage values. As the transistor is driven by the voltage values of the output node 108, it is necessary to greatly swing the voltage values of the output node 108 in the state 1 and in the state 2. Thus, a resistance ratio of approximately two digits is required as the resistance ratio of the first resistive-change element 101 and the second resistive-change element 102. As specific examples of the memory with a resistance ratio of two digits, memories decided by material such as, an ReRAM, an ion memory, a fuse/anti-fuse memory and a field effect memory, and mechanical switches such as, an MEMS switch and an NEMS switch are quoted.

In the case of operating the FPGA, any of the voltages of the first power source 105 and the second power source 106 may be the higher voltage source voltage, but it is preferable that in case that the first switching element 103 is an N channel IGFET the first power source 105 is made at a higher potential and the second power source 106 is made at a lower potential, and it is preferable that in case that the first switching element 103 is a P channel IGFET the first power source 105 is made at a lower potential and the second power source 106 is made at a higher potential.

Next, a method for writing data into the semiconductor integrated circuit of the embodiment will be described using FIGS. 2, 3.

Writing into the first resistive-change element 101 and the second resistive-change element 102 is performed by making the first switching element 103 conducting and giving a writing voltage $V_{prg}$ between the first power source 105 and the second power source 106. In addition, the value of the writing voltage $V_{prg}$ is higher than a writing voltage into a single body of a memory.

Figure 2:
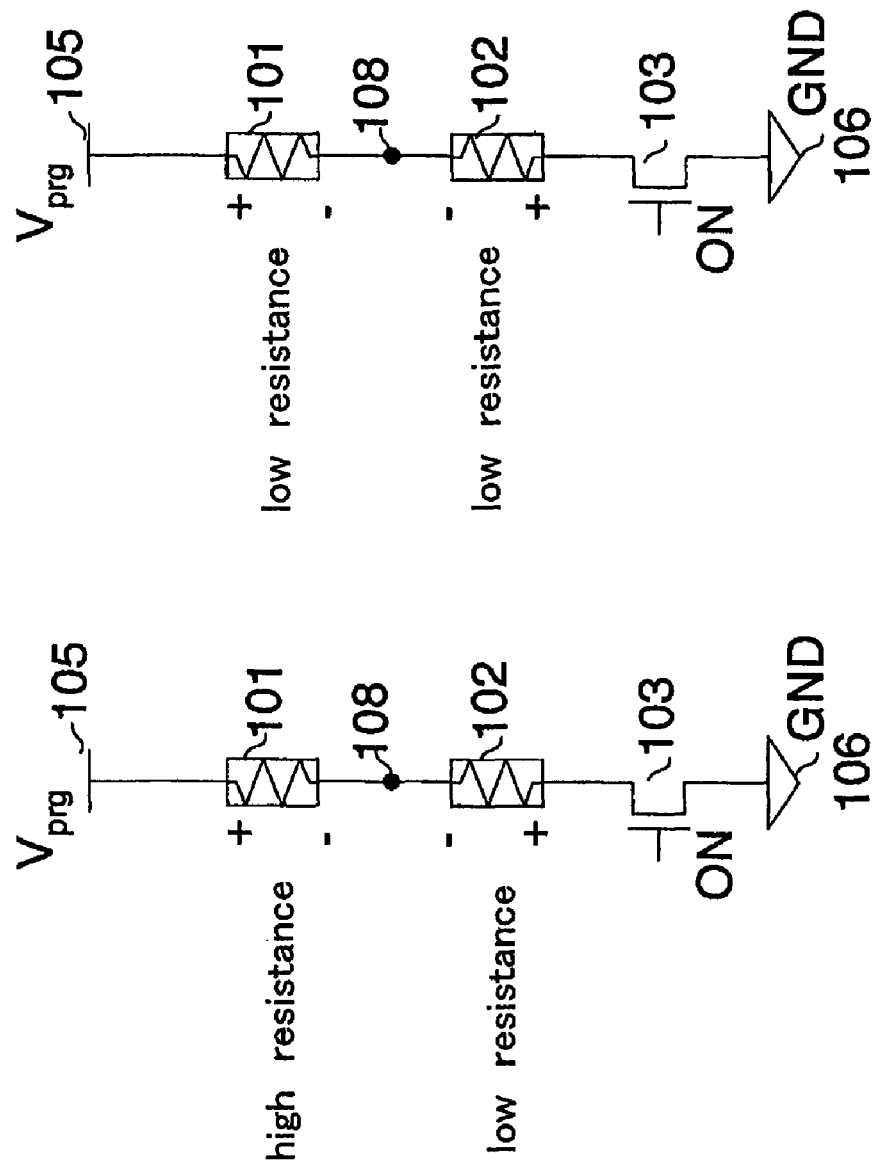
FIG. 2 is a view showing a method for writing data into the semiconductor integrated circuit according to the first embodiment.

A case of programming the two resistive-change elements from the state 1 to the state 2 as shown in FIG. 2 is assumed, for example. This example corresponds to that the writing voltage $V_{prg}$ is applied in the direction from the first power source 105 to the second power source 106. In an early stage of writing shown in FIG. 2A, a voltage approximate to the writing voltage $V_{prg}$ is applied to the first resistive-change element 101 of the high resistance state. For the reason, the first resistive-change element 101 is programmed into the low resistance state. In this stage, both the first resistive-change element 101 and the second resistive-change element 102 become in the low resistance states as shown in FIG. 2B, and the output node 108 becomes at a voltage of about a half of the writing voltage $V_{prg}$. Though a voltage of about a half of the writing voltage $V_{prg}$ is applied to the second resistive-change element 102, if the value is sufficient to program the single body of the resistive-change element, the second resistive-change element 102 is programmed into the high resistance state. Though a voltage of about a half of the writing voltage $V_{prg}$ is similarly applied to the first resistive-change element 101 in this time, as the polarity is a reverse direction in contrast to a direction to be programmed into the high resistance state, the first resistive-change element 101 is not programmed. Thus, finally, the two resistive-change elements are changed into the state 2 as shown in FIG. 2C.

Figure 3:
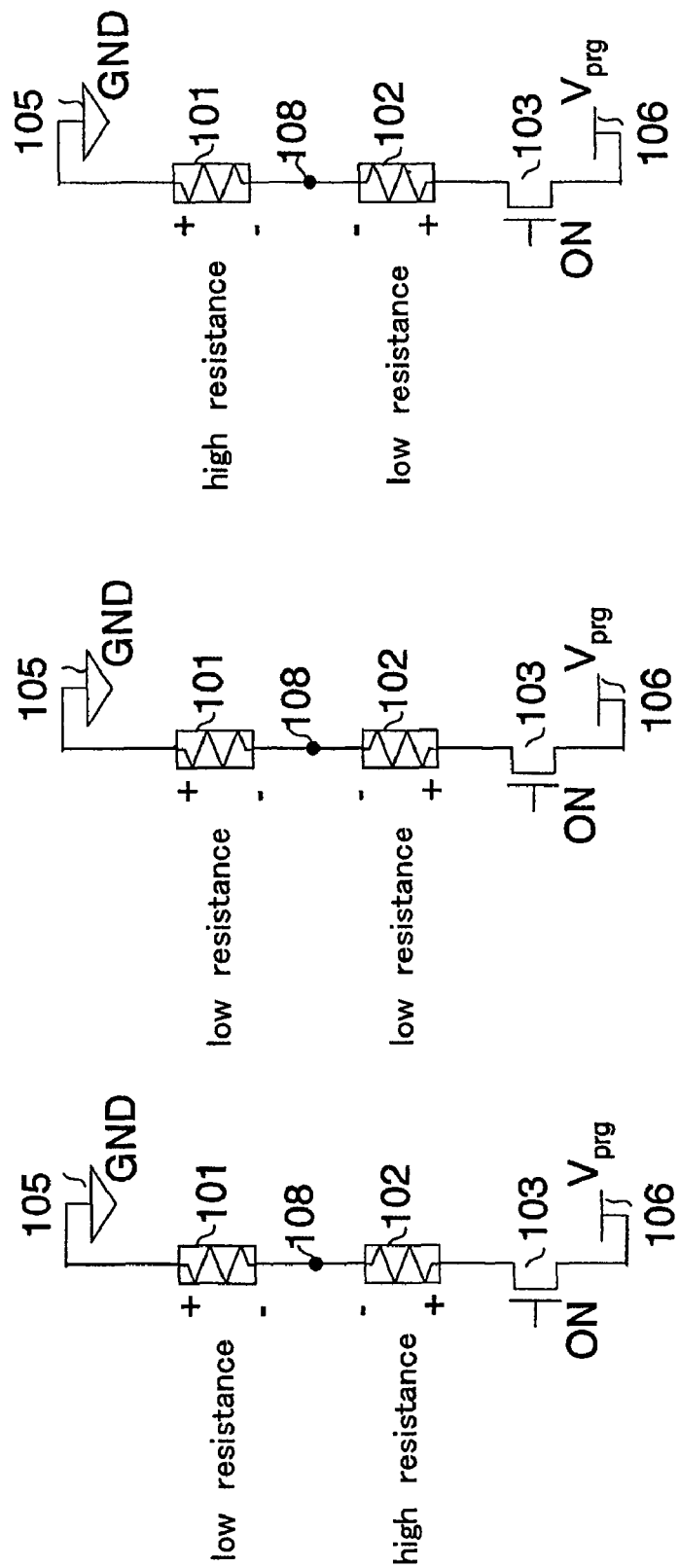
FIG. 3 is a view showing a method for writing data into the semiconductor integrated circuit according to the first embodiment.

In the case of programming from the state 2 to the state 1, it is enough that the writing voltage $V_{prg}$ is applied in the direction from the second power source 106 to the first power source 105 as shown in FIG. 3. In an early stage of writing shown in FIG. 3A, a voltage approximate to the writing voltage $V_{prg}$ is applied to the second resistive-change element 102 of the high resistance state. For the reason, the second resistive-change element 102 is programmed into the low resistance state. In this stage, both the first resistive-change element 101 and the second resistive-change element 102 become in the low resistance states as shown in FIG. 3B, and the output node 108 becomes at a voltage of about a half of the writing voltage $V_{prg}$. Though a voltage of about a half of the writing voltage $V_{prg}$ is applied to the first resistive-change element 101, if the value is sufficient to program the single body of the resistive-change element, the first resistive-change element 101 is programmed into the high resistance state. In this time, a voltage of about a half of the writing voltage is similarly applied to the second resistive-change element 102, as the polarity is a reverse direction to a direction in contrast to be programmed into the high resistance state, the second resistive-change element 102 is not programmed. Thus, finally, the two resistive-change elements are changed into the state 1 as shown in FIG. 3C.

In addition, in case that the first switching element 103 is an N channel IGFET, and in case that the writing voltage $V_{prg}$ is applied in the direction from the second power source 106 to the first power source 105, it is necessary to conduct the first switching element 103 with attention to that a voltage drop is generated in accordance with a threshold voltage of the first switching element 103. There are methods, such as, giving a higher voltage as the gate voltage, lowering the threshold value by giving a substrate bias, using a device with short channel length and large channel width, and giving a higher voltage as the writing voltage $V_{prg}$.

In case that the writing voltage $V_{prg}$ is applied to the memory already in the state 2 in the direction from the first power source 105 to the second power source 106, most of the voltage is applied to the second resistive-change element 102 of the high resistance state, but as the polarity is a reverse direction to a direction in contrast to be programmed into the low resistance state, the second resistive-change element 102 is not programmed, and the state 2 is kept. Conversely, in case that the writing voltage $V_{prg}$ is applied to the memory in the state 1 in the direction from the second power source 106 to the first power source 105, most of the voltage is applied to the first resistive-change element 101 of the high resistance state, but as the polarity is a reverse direction in contrast to a direction to be programmed into the low resistance state, the first resistive-change element 101 is not programmed, and the state 1 is kept. That is, it is possible to change the state by the direction of the programming voltage without attention to the present state of the memory.

As described above, in the semiconductor integrated circuit of the embodiment, as the first switching element 103 is provided in series with the resistive-change elements, it is possible to eliminate that the current flow into and to avoid false writing in the case of writing to the other memory cell, by making the first switching element 103 non-conducting. In addition, as the memory with a large resistance ratio is used, it is possible to make the voltage amplitude of the output node 108 high, and it is possible to control directly the conduction or non-conduction of the second switching element 104. In addition, as the output node 108 is directly connected to the gate of the second switching element 104, current does not flow into from the memory reading wire, and it is possible to avoid false writing. In addition, at the time of writing operation, the writing voltage Vprg that is a comparatively high voltage may happen to be applied to the gate of the second switching element 104, if the programming time is a short time, there is no problem in reliability.

In case that a resistance value of the first resistive-change element 101 or the second resistive-change element 102 in the high resistance state is large, it is necessary to give attention to an off-resistance of the first switching element 103. It is because, in case that the off-resistance is small, in other words, the off-leak current is large, the non-selected memory cell may possibly be falsely written.

Figure 4:
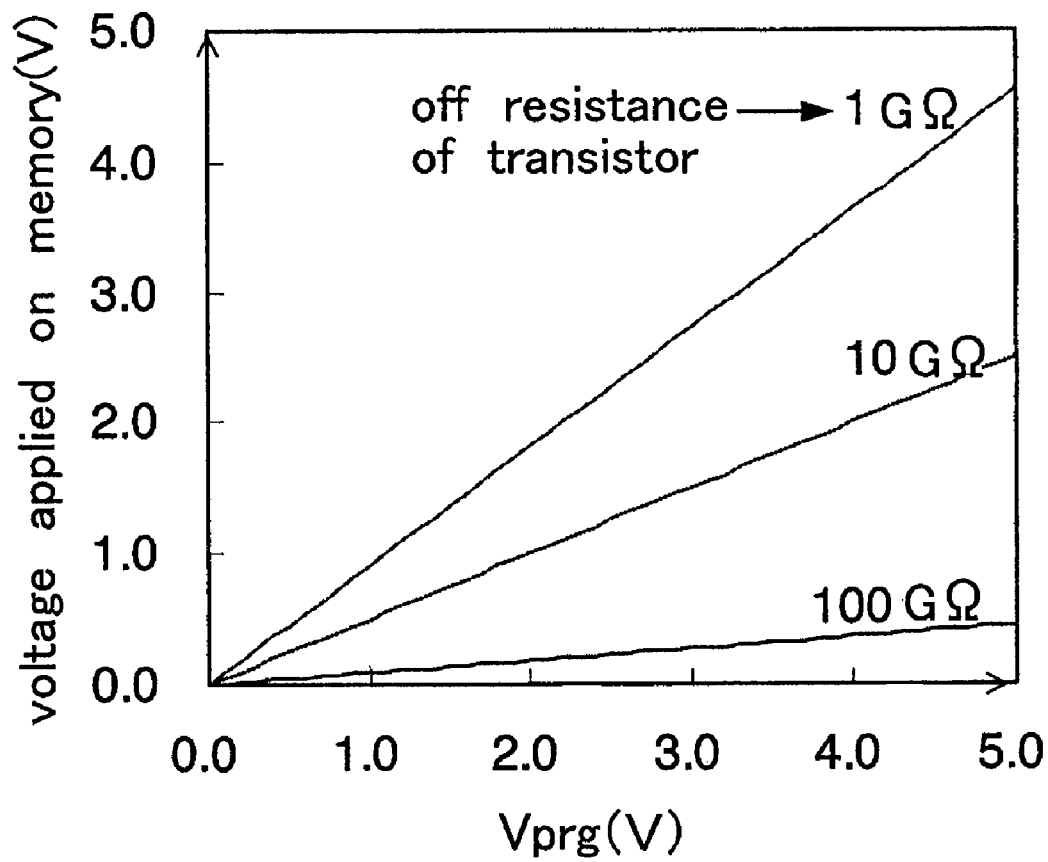
FIG. 4 is a view showing relations between voltages to be applied to two resistive-change elements and OFF resistances of the first switching element 103.

FIG. 4 shows relations between the writing voltage Vprg to be applied in the direction from the first power source 105 to the second power source 106 and the voltage to be applied to the two resistive-change elements, for a few cases of the off-resistances of the first switching element 103, assuming that the resistance value of the resistive-change element in the high resistance state is 10 GΩ. Actually, as the leak current itself is a function of the writing voltage Vprg, it is necessary to consider the detail in accordance with to the switching elements to be used and the programming voltage. But if roughly the off-resistance of the switching element is about 1 GΩ, the high voltage may be applied to the resistive-change element, and the switching element becomes of no use, and it is found that about 10 GΩ is necessary as the off-resistance. That is, it is necessary to make the off-leak current not more than 100 pA.

In the case of writing into the memory cell, the relation between the resistance value of the resistive-change element and the transistor property of the first switching element is obtained from the condition that both the selected cell and the non-selected cell operate stably. It is assumed that a resistance of the resistive-change element in the high resistance state is $R_{off}$, a resistance of the resistive-change element in the low resistance state is $R_{on}$ and an off-leak current of the first switching element 103 is $I_{off}$. As most of a voltage due to the leak is applied to the memory in the high resistance state, it is necessary that the state of the memory is not rewritten in this time. Assuming that there is no problem if the voltage can be suppressed not more than $V_{prg}/n$ using an arbitrary positive number n of not less than 1, the condition in this time can be written as $$I_{off} \cdot R_{off} < \frac{V_{prg}}{n} \qquad (1)$$

Generally, as the voltage necessary for changing from the high resistance to the low resistance is higher, it is thought good that n is about 2 to 3.

On the other hand, the case where the current is needed most is a case where both the first resistive-change element 101 and the second resistive-change element 102 become in the low resistance states as described in the above-described rewriting operation, and in this time, a voltage of about a half of the writing voltage Vprg is applied to each of the resistive-change elements. Assuming that an on-current of the first switching element 103 is $I_{on}$, $$I_{on} > \frac{V_{prg}}{2R_{on}} \quad (2)$$

is given as a condition for $I_{on}$.

From (1), (2), it is necessary that an on-off ratio of the first switching element 103 is $$\frac{I_{on}}{I_{off}} > \frac{nR_{off}}{2R_{on}} \quad (3)$$

In addition, assuming that a sub threshold factor (a gate voltage necessary to raise the current by one digit) of the first switching element 103 is S, it is necessary that a threshold voltage Vth of the first switching element 103 satisfies the condition $$V_{th} = S \cdot \log_{10} \frac{I_{on}}{I_{off}} > S \cdot \log_{10} \frac{nR_{off}}{2R_{on}} \quad (4)$$

In case that n=2, a resistance ratio of the memory is 6 digits, and S=60 mV/dec, for example, it is necessary that the threshold voltage $V_{th}$ is made larger than 0.36 V. If the threshold voltage which is required in (4) is not realized by only the device design, it may be good that the threshold voltage is satisfied by applying a substrate bias.

In addition, as a matter of course, it is necessary that the threshold voltage $V_{th}$ is smaller than the higher voltage source voltage $V_{dd}$ and the writing voltage Vprg as shown in an expression (5) below.

$$V_{prg} > V_{dd} > V_{th} \quad (5)$$

The first switching element 103 is designed so as to satisfy the expressions (1) to (5).

With respect to the leak current, the leak current is larger in the case that the second power source 106 is made at the high potential and the writing voltage Vprg is applied than in the case that the first power source 105 is made at the high potential and the writing voltage Vprg is applied. This is because in the former case, as there is the voltage drop due to the first resistive-change element 101 and the second resistive-change element 102, the voltage applied to the switching element is made smaller, on the other hand, in the latter case, the writing voltage Vprg is applied directly to the switching element. In the FPGA, it is expected that the wiring to make the second switching element 104 non-conducting is more than the wiring to make conducting. Therefore, in case that the first power source 105 is made at the high potential and the writing voltage Vprg is applied, if the second switching element 104 is made non-conducting, which become advantageous in power consumption. Though made into the state 1 in this time, this is of course changed by the polarity of the memory and the kind of the second switching element 104.

Next, a device construction of the semiconductor integrated circuit of the embodiment and its manufacturing method will be described using FIG. 5 to 11.

Figure 5:
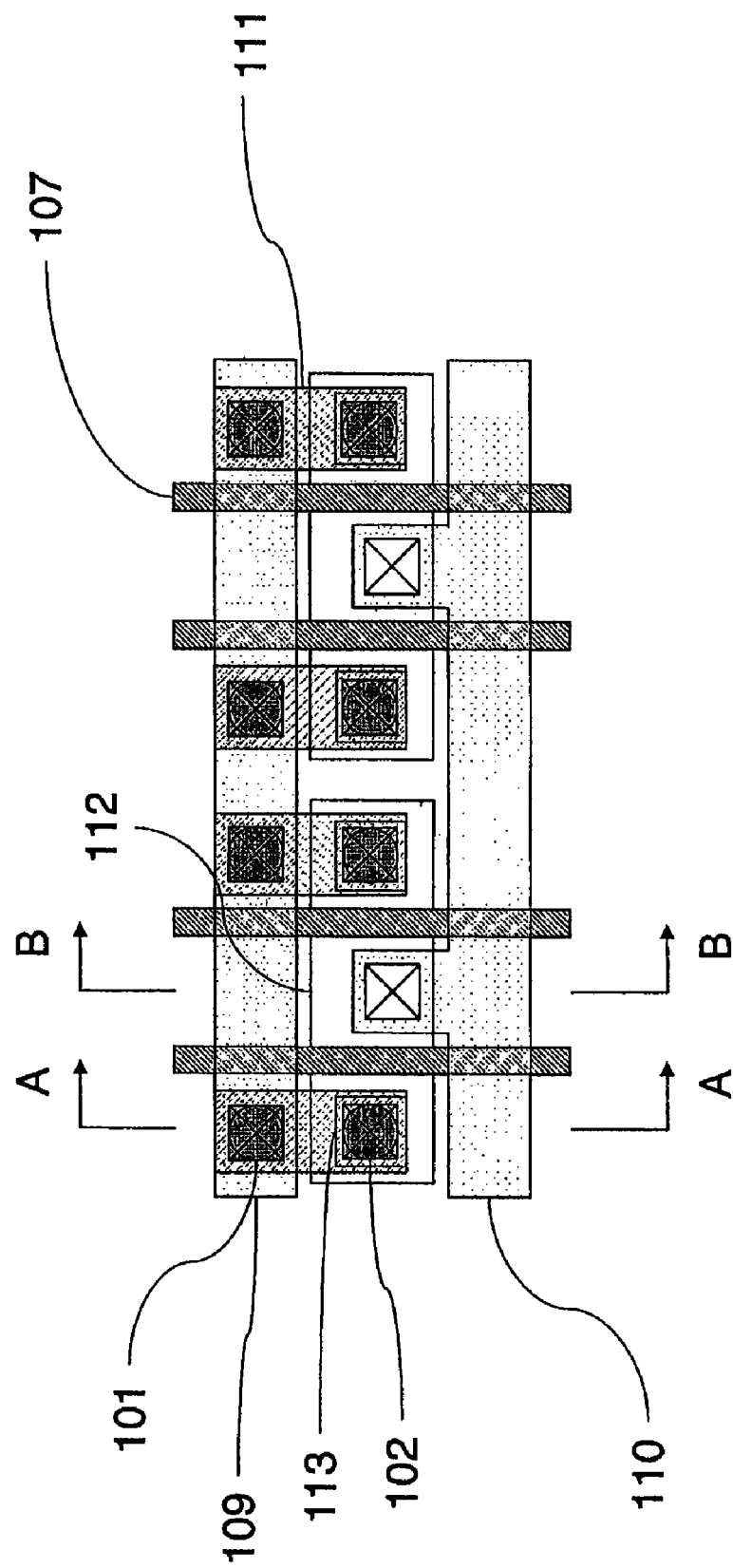
FIG. 5 is a top view of the first resistive-change elements 101, the second resistive-change elements 102 and the first switching elements 103.

FIG. 5 is a top view of the first resistive-change elements 101, the second resistive-change elements 102 and the first switching elements 103. In the drawing, the first resistive-change element 101 and the second resistive-change element 102 are shown by circle marks. One end of the first resistive-change element 101 and one end of the second resistive-change element 102 are connected by a second connection wiring layer 111. Another end of the first resistive-change element 101 is connected to a first bit line (BL1) 109 that is the first power source, and another end of the second resistive-change element 102 is connected to a first activation region 112 that is a drain of the first switching element (transistor) 103 via a first connection wiring layer 113. The activation region 112 and a gate electrode 107 form the first switching element (transistor) 103. An end of the first activation region 112 at an opposite side across the gate electrode 107 is a source region, and as shown in the drawing, the source region is mutually connected to a source region of another switching element. A second bit line (BL2) 110 that is the second power source is connected to a source of the first switching element 103 via a contact.

Figure 6B:
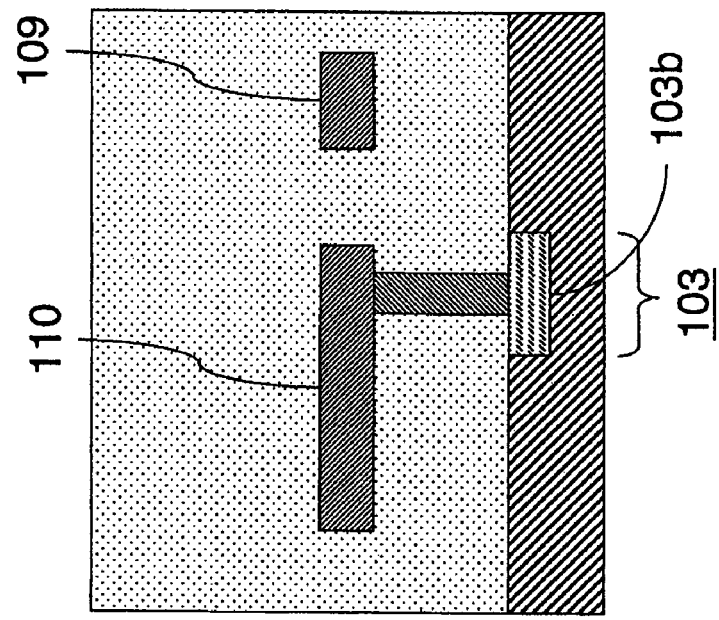
FIG. 6 is a view showing an A-A cross section and a B-B cross section of FIG. 5.
Figure 6A:
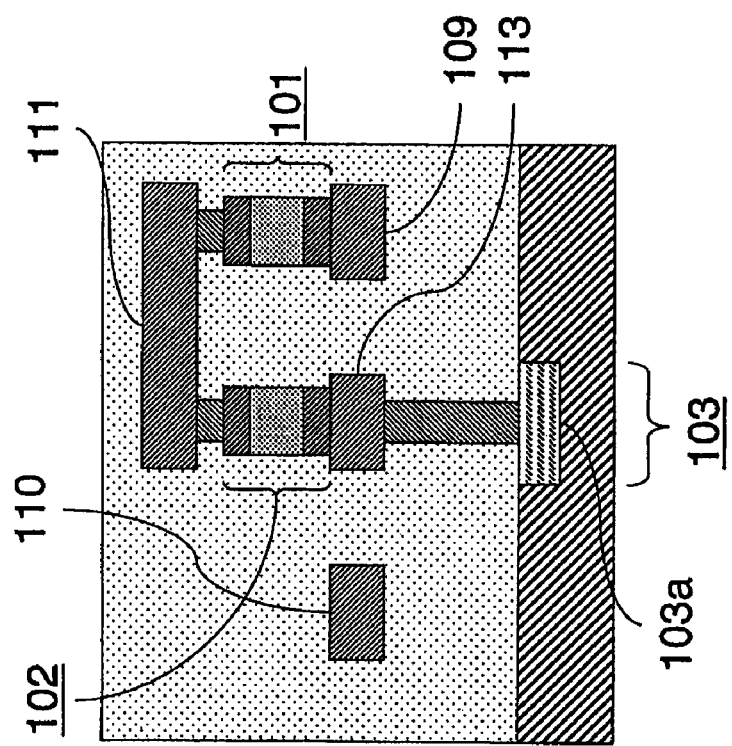

FIG. 6A is a sectional view at A-A in FIG. 5, and FIG. 6B is a sectional view at B-B in FIG. 5. In FIG. 6A, a drain region 103a of the first switching element 103 is connected to the second resistive-change element 102 through the first connection wiring layer 113 via a contact plug. The first connection wiring layer 113 and the first bit line 109 are arranged adjacent to the second bit line 110. The second bit line 110, the first connection wiring layer 113 and the first bit line 109 are formed by patterning the same layer as described later. The first resistive-change element 101 is arranged on the first bit line 109. The first resistive-change element 101 is composed of a lower electrode, an element main body and an upper electrode in this order from the lower layer. On the other hand, the second resistive-change element 102 is arranged on the first connection wiring layer 113. The second resistive-change element 102 is also composed of a lower electrode, an element main body and an upper electrode in this order from the lower layer in the same way as the first resistive-change element 101. The upper electrodes of the first resistive-change element 101 and the second resistive-change element 102 are connected to the second connection wiring layer 111. Though not shown, the second connection wiring layer 111 is connected to a gate electrode of the second switching element 104.

In FIG. 6B, a source region 103b of the first switching element 103 is connected to the second bit line 110 via a contact plug. The first bit lien 109 is arranged in the same layer as the first connection wiring layer 110.

In FIG. 5, the four memory cells are shown, by making two contacts of the first switching element 103 at the second power source 106 side common in the two cells by the first activation region 112, it is possible to reduce the cell area. In addition, by forming the first bit line 109, the second bit line 110 and the first connection wiring layer 113 in the same layer and by wiring in the same direction, it is possible to reduce the cell area. The two resistive-change elements are arranged parallel in the direction of the gate electrode 107 of the first switching element 103, and it is possible to arrange the resistive-change elements at the lower portion of the second connection wiring layer 111. Accordingly, it is possible to realize the memory cell with the two wiring layers by laying out as shown in FIG. 5, so that it is possible to save the wiring resource.

In addition, in the drawing, the first resistive-change element 101 and the second resistive-change element 102 are respectively formed between the first bit line 109 and the second connection wiring layer 111, and between the first connection wiring layer 113 and the second connection wiring layer 111, but the arrangement is not necessarily limited to this. By using an optional conductive layer of an n-th layer and a conductive layer of an upper m-th layer, it may be possible to arrange the memory cell between the layers. In addition, the first connection wiring layer 113 and the lower electrode of the second resistive-change element 102 may be made of the same construction. In addition, the second connection wiring layer 111 and the upper electrode of the first resistive-change element 101 may be made of the same construction.

Next, a method for manufacturing the semiconductor integrated circuit shown in FIGS. 5, 6 will be described using FIGS. 7 to 11. In FIGS. 7 to 11, A shows a cross sectional view at A-A and B shows a cross sectional view at B-B, respectively.

Figure 7B:
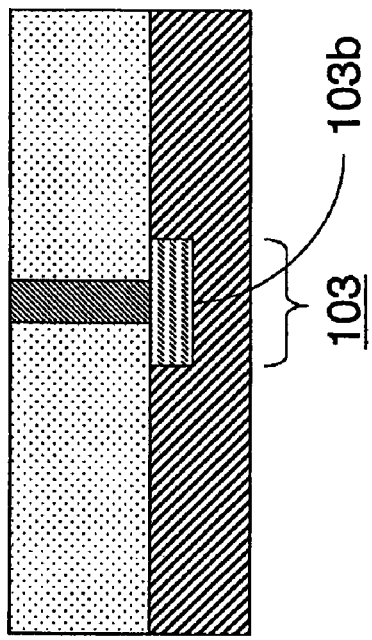
Figure 7A:
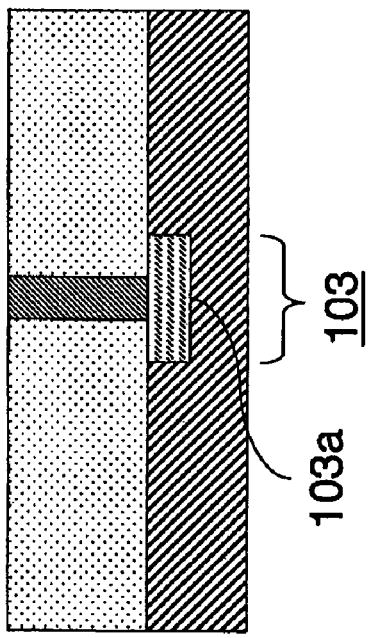

To begin with, as shown in FIG. 7, the first switching element 103 is formed at an element region on a semiconductor substrate. Then the semiconductor substrate is coated with an interlayer insulating film, and contact holes are opened on the source and drain of the first switching element 103. After opening, while forming contact plugs to embed the contact holes by a method such as damascene method, a conductive layer is formed on the interlayer insulating layer.

Figure 8B:
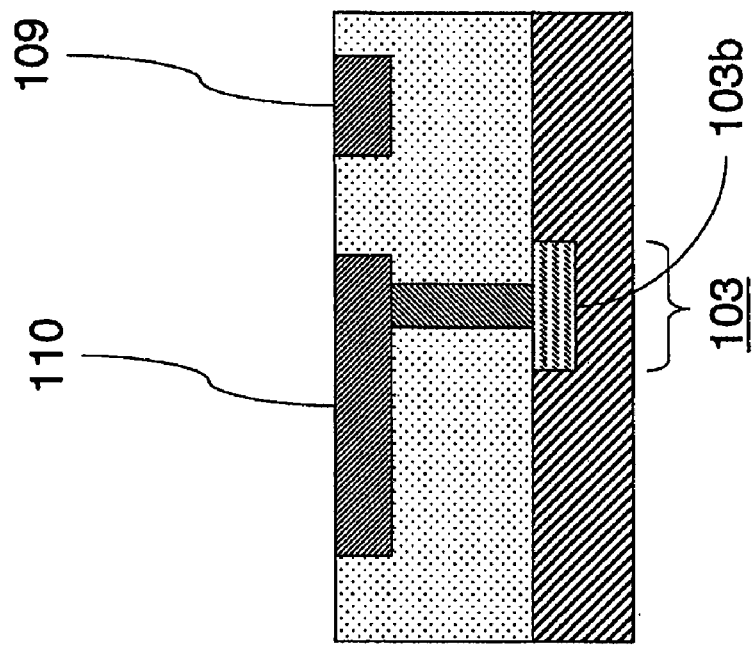
Figure 8A:
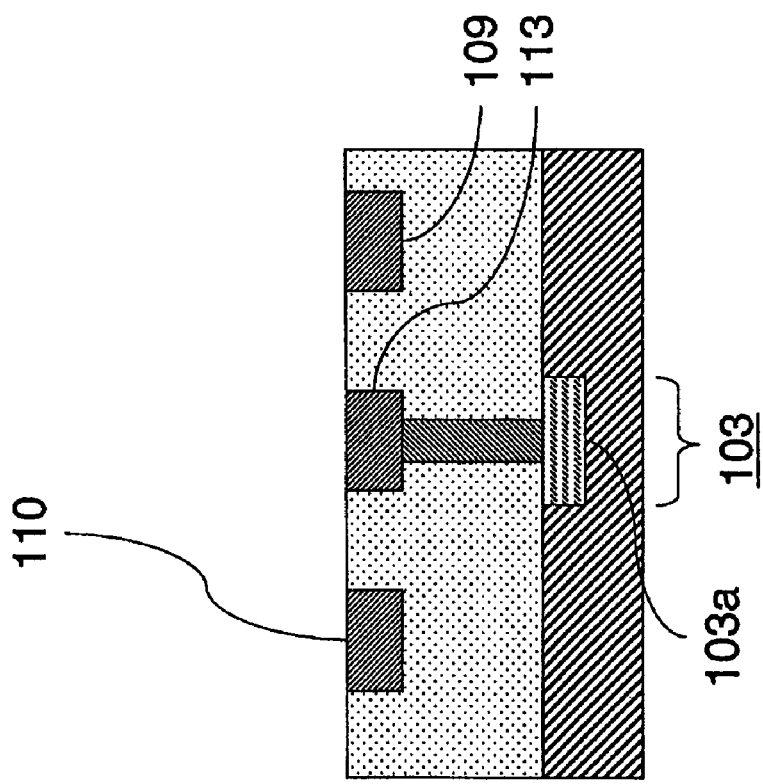

Then, as shown in FIG. 8, the first bit line 109, the second bit line 110 and the first connection wiring layer 113 are formed by patterning the conductive layer with a method such as spatter etching. The interlayer insulating layer is formed to embed among the first bit line 109, the second bit line 110 and the first connection wiring layer 113.

Figure 9B:
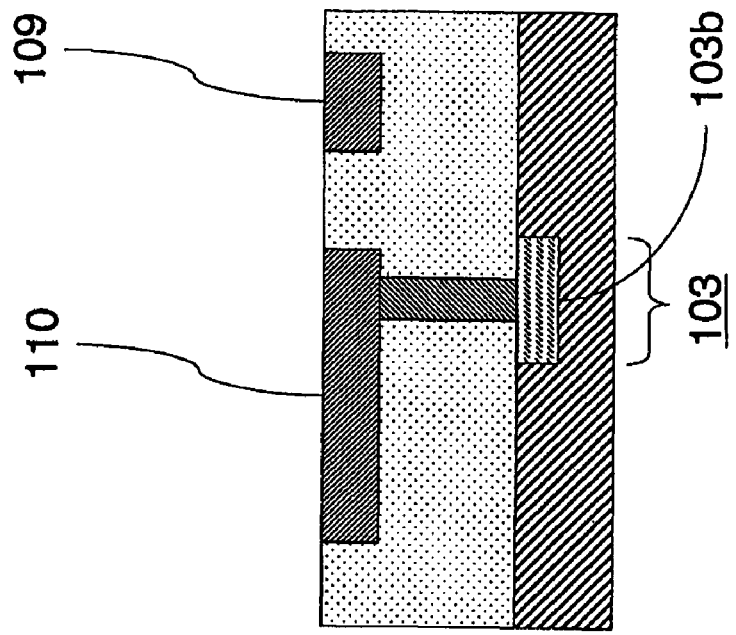
Figure 9A:
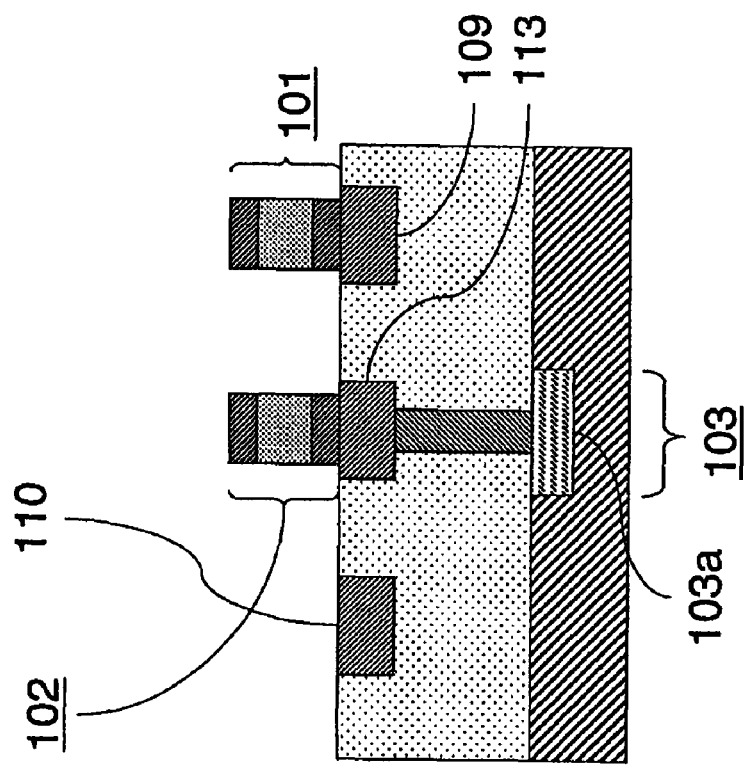

Next, as shown in FIG. 9, by laminating layers which will respectively become the lower electrodes, the element main bodies and the upper electrodes of the resistive-change elements in this order, and by etching processing into the element sizes, the first resistive-change element 101 and the second resistive-change element 102 are formed. By this process, to form films of the memory cell can be done at one time, so that it is possible to reduce the number of processes.

Figure 11B:
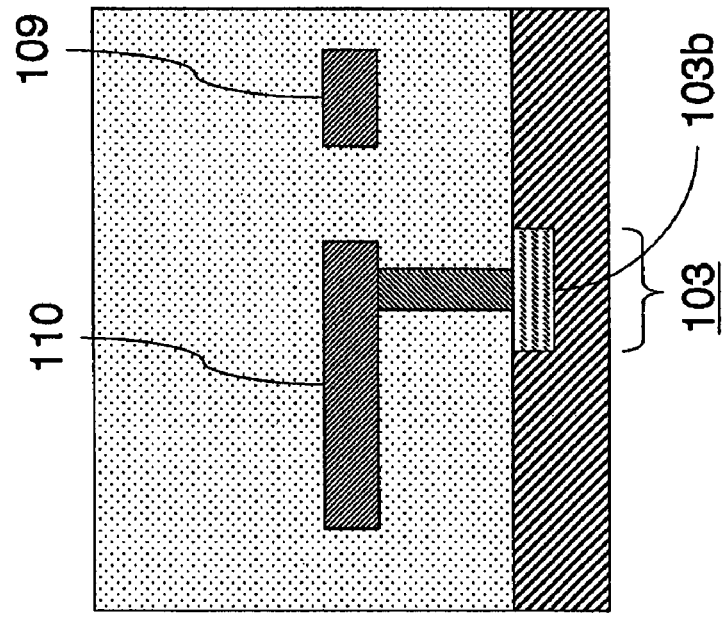
Figure 11A:
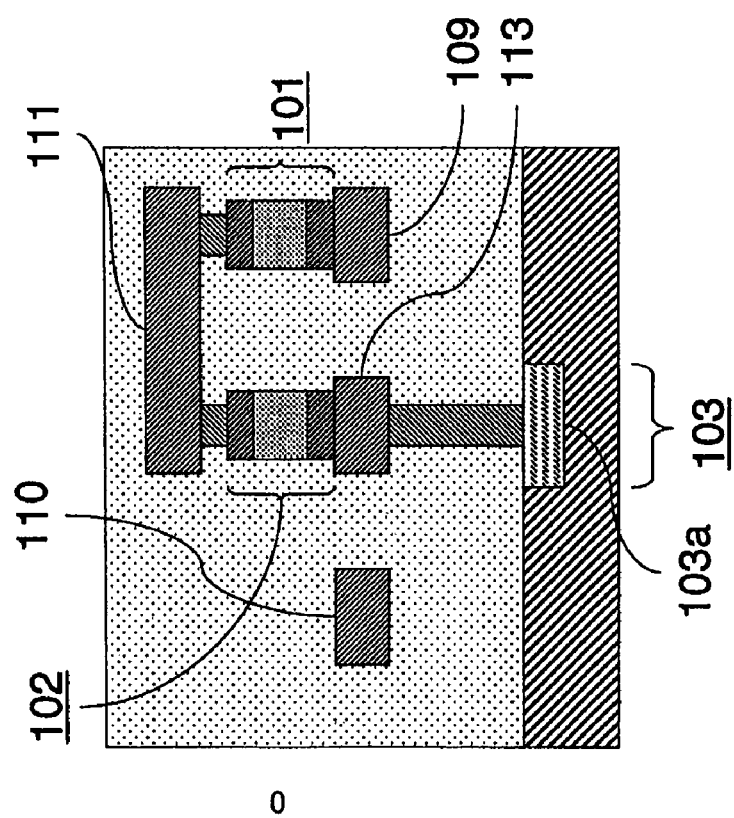

Then as shown in FIGS. 10, 11, the first resistive-change element 101 and the second resistive-change element 102 are covered by an interlayer insulating layer, and the contact holes are opened to expose respectively the surfaces of the upper electrodes of the first resistive-change element 101 and the second resistive-change element 102. After opening, while forming contact plugs to embed the contact holes by a method such as damascene method, a conductive layer is formed on the interlayer insulating layer. Then, by patterning the conductive layer with a method such as spatter etching, the second connection wiring layer 111 is formed.

Then, by connecting the second connection wiring layer 111 to the gate electrode (not shown) of the second switching element 104, the semiconductor integrated circuit of the embodiment is completed.

Figure 12B:
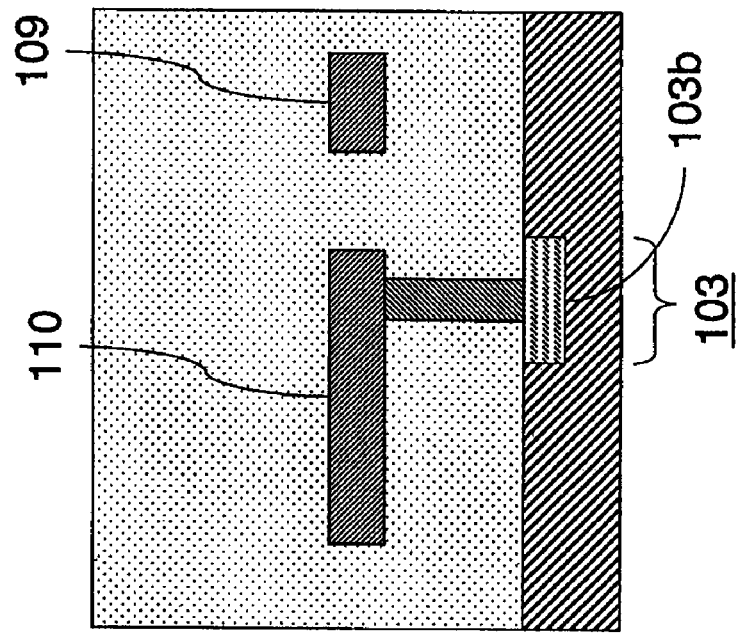
FIG. 12 is a view showing another example of an A-A cross section and a B-B cross section of FIG. 5.
Figure 12A:
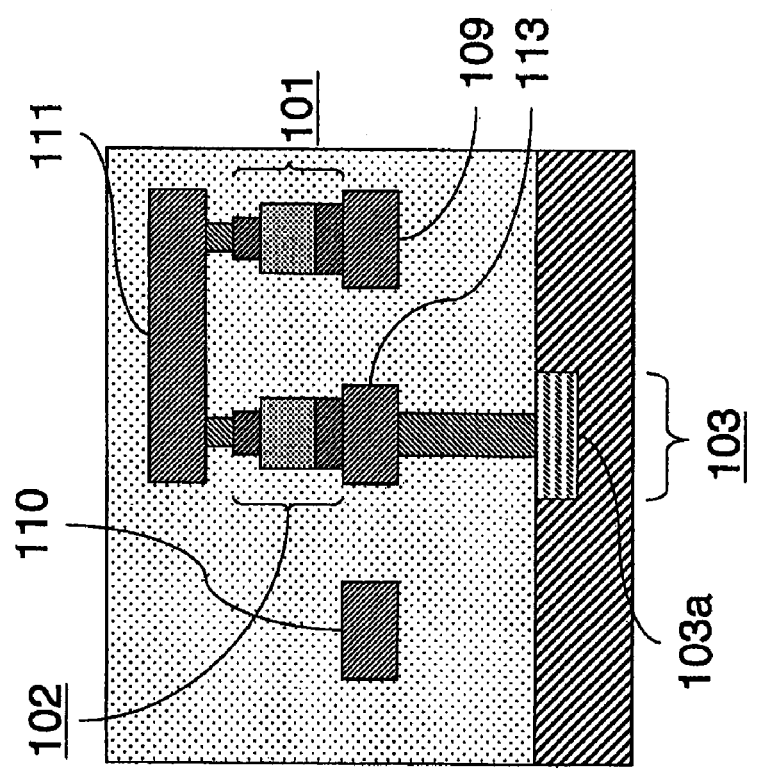

FIG. 12 shows another example of a cross section at A-A and a cross section B-B in FIG. 5. The difference from the construction in FIG. 6 is that the widths of the upper electrodes of the first resistive-change element 101 and the second resistive-change element 102 are respectively the same as the widths of the element main bodies and the lower electrodes of the first resistive-change element 101 and the second resistive-change element 102 in the construction of FIG. 6, on the other hand, the widths of the upper electrodes in the construction of FIG. 12 are respectively smaller than those of the element main bodies and the lower electrodes. With the construction of FIG. 12, it is possible to suppress the leak current at the side face of the resistive-change element.

In addition, in the construction of FIG. 12, the first resistive-change element 101 and the second resistive-change element 102 are respectively formed between the first bit line 109 and the second connection wiring layer 111, and between the first connection wiring layer 113 and the second connection wiring layer 111, in the same way as the construction of FIG. 6, but the arrangement is not necessarily limited to this.

By using an optional conductive layer of an n-th layer and a conductive layer of an upper m-th layer, it may be possible to arrange the memory cell between the layers. In addition, the first connection wiring layer 113 and the lower electrode of the second resistive-change element 102 may be made of the same construction. In addition, the second connection wiring layer 111 and the upper electrode of the first resistive-change element 101 may be made of the same construction.

Next, a manufacturing process of the semiconductor integrated circuit of FIG. 12 will be described using FIGS. 13 to 18. In FIGS. 13 to 18, A shows a cross sectional view at A-A and B shows a cross sectional view at B-B, respectively.

Figure 13B:
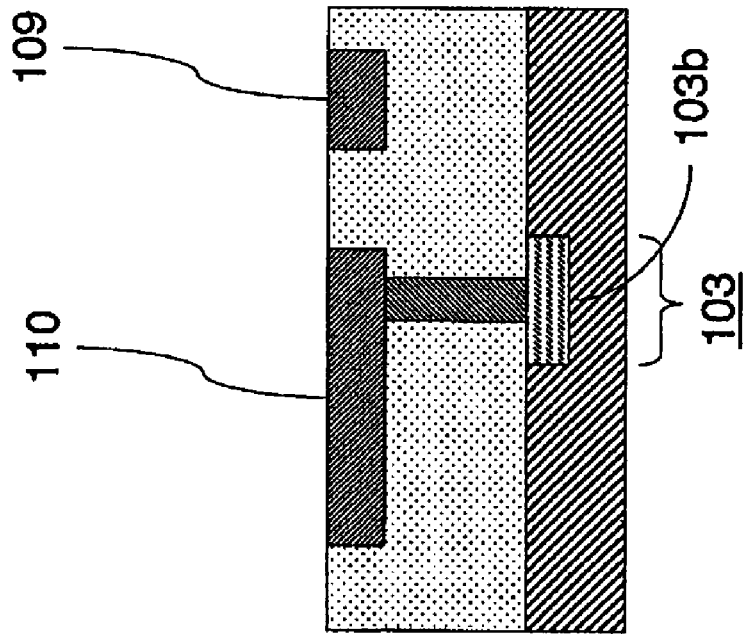
FIGS. 13 to 17 are views showing a manufacturing process of the semiconductor integrated circuit shown in FIG. 12.
Figure 13A:
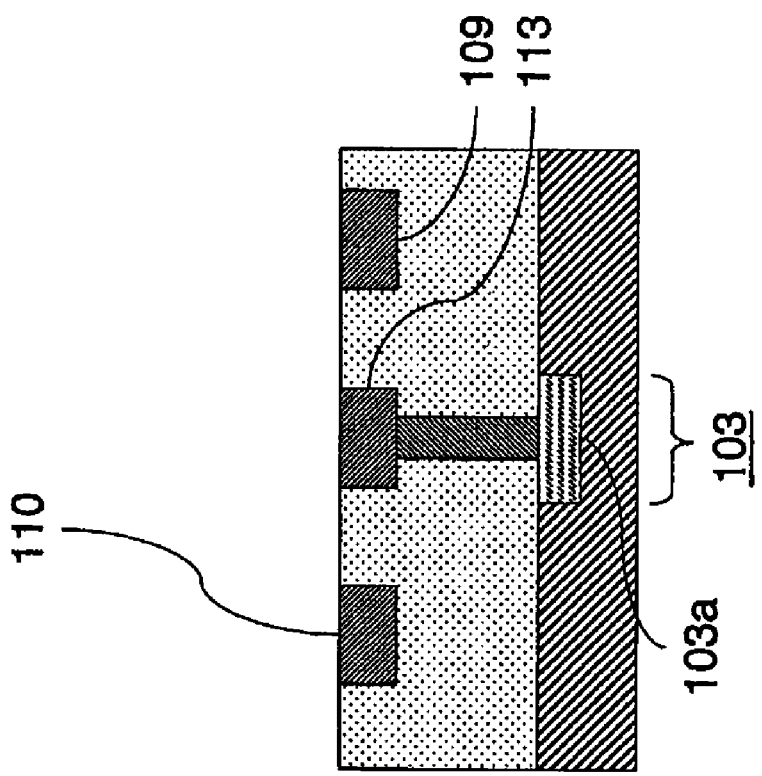

To begin with, as shown in FIG. 13, the first switching element 103 is formed at the device region on the semiconductor substrate. Then the semiconductor substrate is coated with an interlayer insulating film, and contact holes are opened on the source and drain of the first switching element 103. After opening, while forming contact plugs to embed the contact holes by a method such as damascene method, a conductive layer is formed on the interlayer insulating layer. Then, by patterning the conductive layer with a method such as spatter etching, the first bit line 109, the second bit line 110 and the first connection wiring layer 113 are formed. And the interlayer insulating layer is formed to embed among the first bit line 109, the second bit line 110 and the first connection wiring layer 113.

Figure 14B:
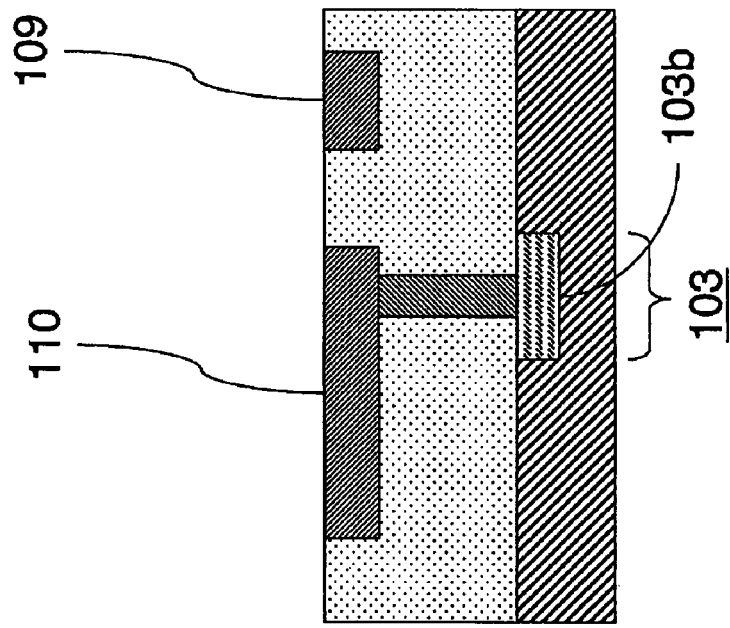
Figure 14A:
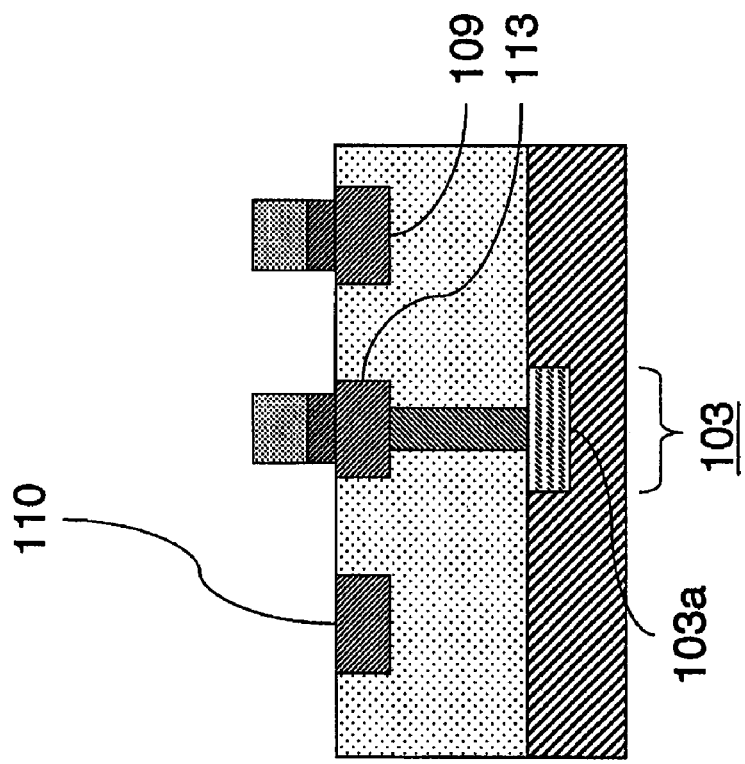

Next, as shown in FIG. 14, layers are laminated which will become respectively the lower electrodes and the element main bodies of the resistive-change elements in this order, and are etching processed into the device sizes.

Figure 15B:
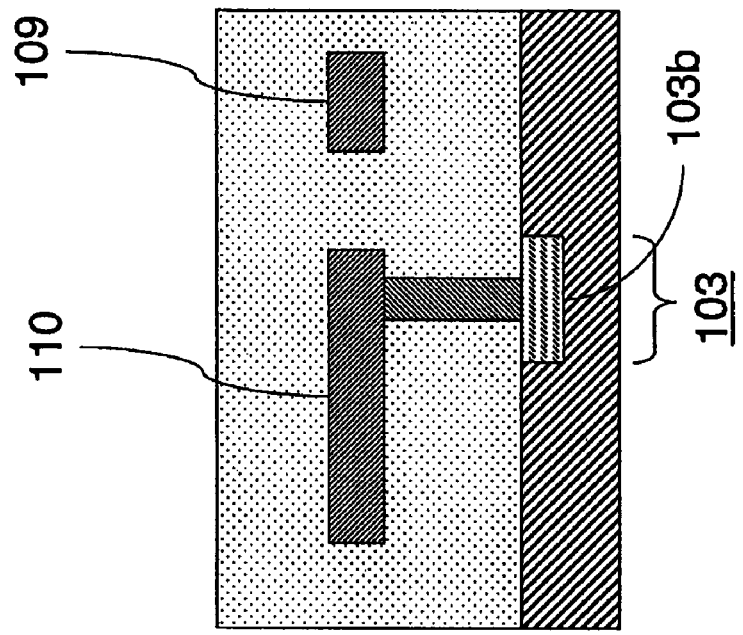
Figure 15A:
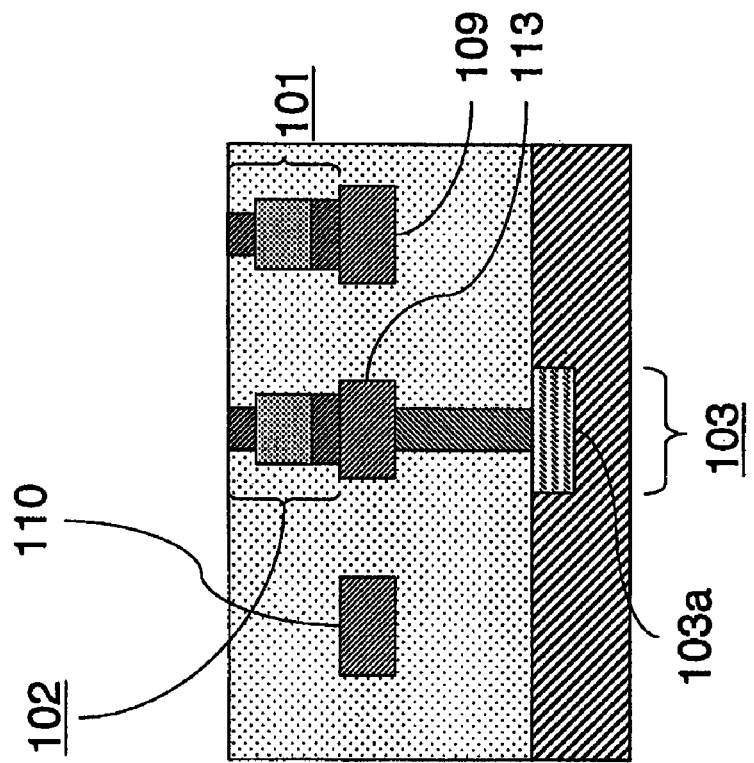

After etching processing, the lower electrodes and the element main bodies of the first resistive-change element 101 and the second resistive-change element 102 are coated with an interlayer insulating layer, and openings are formed to expose respectively the surfaces of the element main bodies of the first resistive-change element 101 and the second resistive-change element 102. After forming openings, the materials of the upper electrodes are respectively deposited in the openings with a method such as spattering as shown in FIG. 15.

Figure 16B:
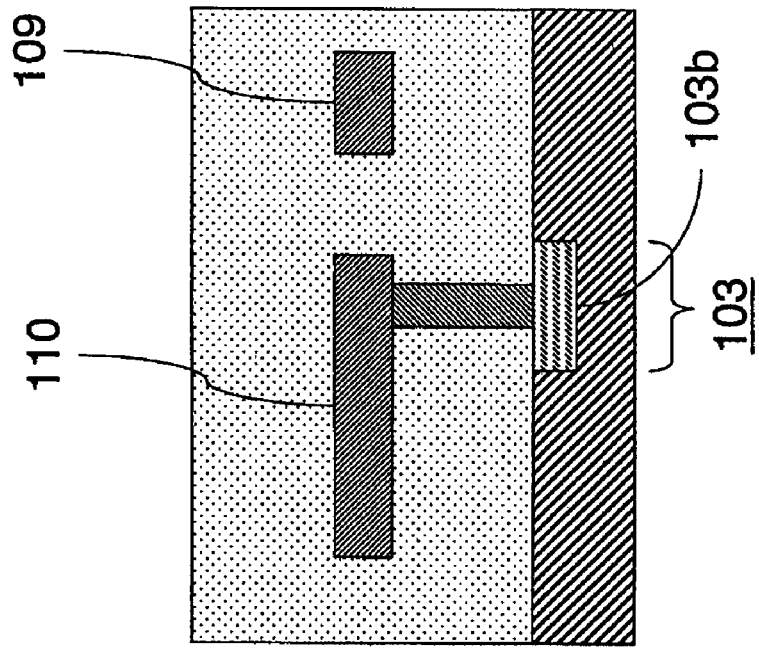
Figure 16A:
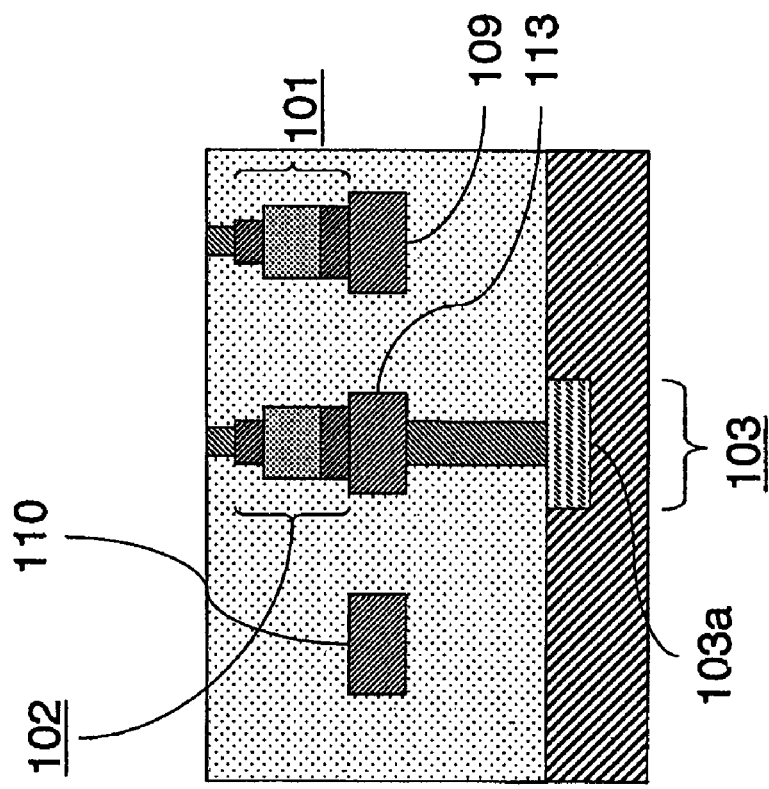
Figure 17B:
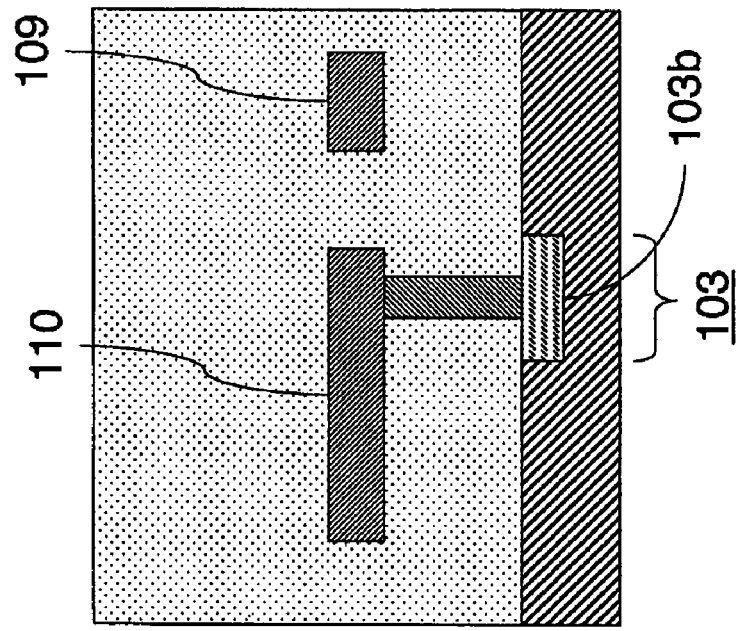
Figure 17A:
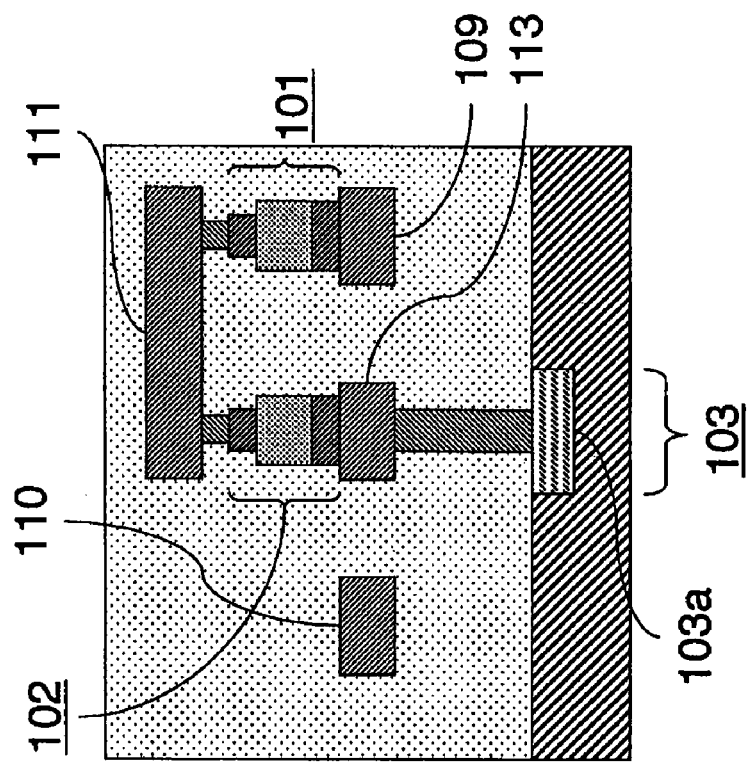

Then as shown in FIGS. 16, 17, the first resistive-change element 101 and the second resistive-change element 102 are covered by an interlayer insulating layer, and the contact holes are opened to expose respectively the surfaces of the upper electrodes of the first resistive-change element 101 and the second resistive-change element 102. After opening, while forming contact plugs to embed the contact holes by a method such as damascene method, a conductive layer is formed on the interlayer insulating layer. Then, by patterning the conductive layer with a method such as spatter etching, the second connection wiring layer 111 is formed.

Then, by connecting the second connection wiring layer 111 to the gate electrode (not shown) of the second switching element 104, the semiconductor integrated circuit of the embodiment is completed.

As described above, in the manufacturing process of FIGS. 13 to 17, there is a merit that the adjustment of the element size can be made and controlled easily by the sizes of the resistive-change elements.

Figure 18:
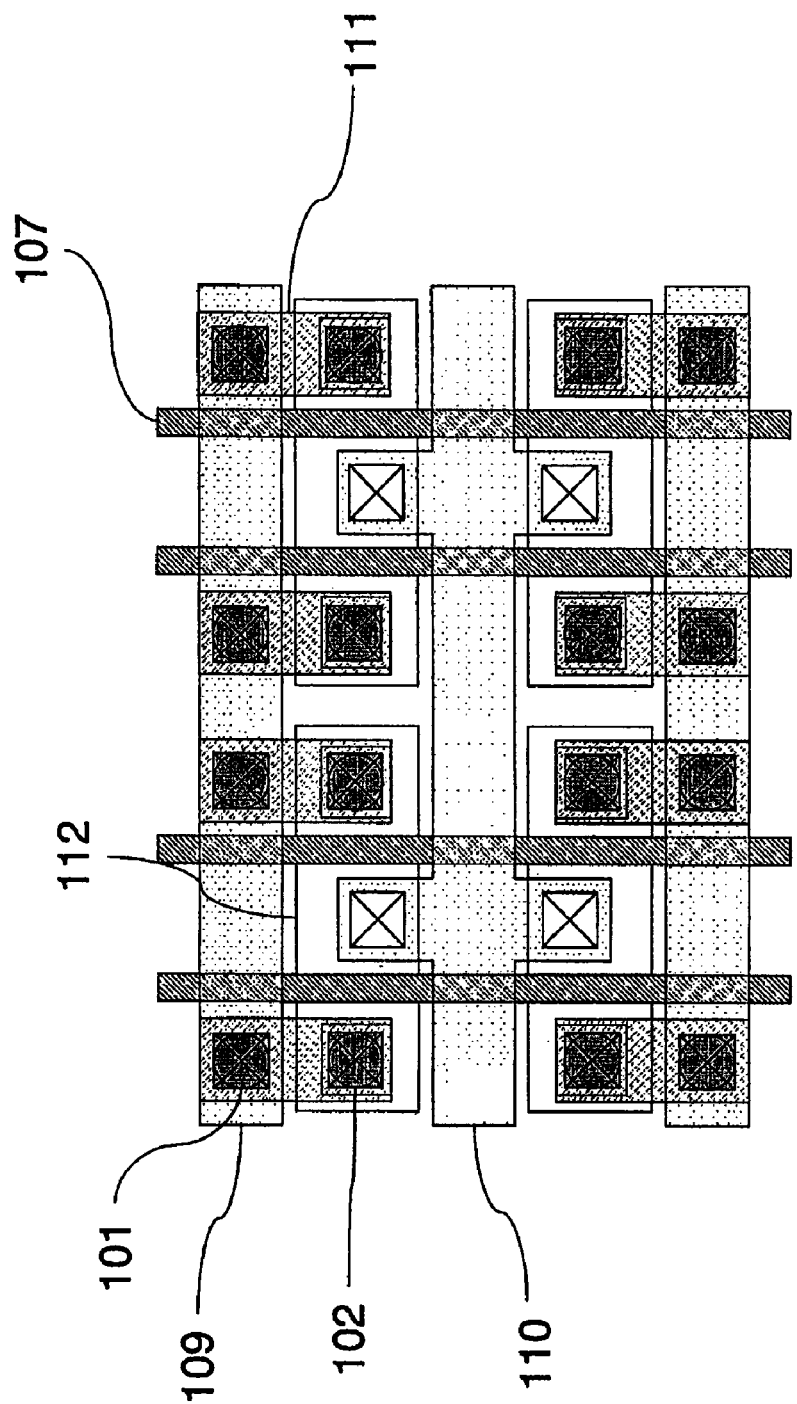
FIG. 18 is a view showing a modification of a device construction of the semiconductor integrated circuit shown in FIG. 5.

A construction of FIG. 18 is made possible, as a modification of the element construction of the semiconductor integrated circuit shown in FIG. 5, by devising applying method of the writing voltage. FIG. 18 shows a top view of the first resistive-change elements 101, the second resistive-change elements 102 and the first switching elements 103 in case that the eight memory cells are arrange. The difference from FIG. 5 is that the gate electrode 107 of the first switching elements 103 is shared and the second bit line 110 is also shared among the memory cells arranged in the up and down direction of FIG. 18. As the other is the same as the construction of FIG. 5, the description will be omitted. By making the construction as this, it is possible to reduce the cell area. In the case of this construction, as the second bit line 110 is shared, the writing operation is performed by setting a potential of the first bit line 109. That is, at the time of writing operation, a potential of the second bit line 110 is made at a common potential $V_0$, and the potential to be given to the first bit line 109 is made at $+V_{prg}$ or $-V_{prg}$, and writing is performed by changing the direction of the voltage. It is possible to reduce the cell area by sharing the gate electrode 107 and the second bit line 110.

In FIG. 18, the second bit line 110 is shared, it is also possible that the first bit line 109 is shared and writing is performed by setting the potential of the second bit line 110. In addition, if the gate electrode 107 is shared and the bit lines are not shared, it is possible to reduce the cell area without changing for setting of the writing operation.

Figure 19:
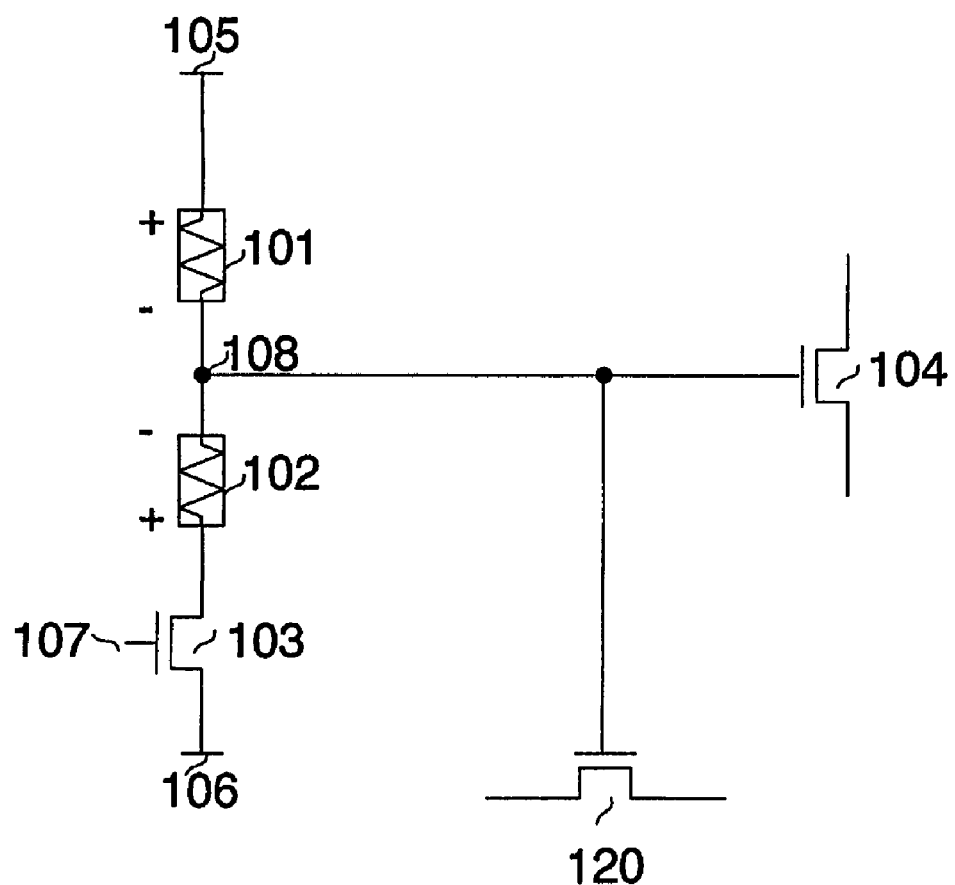
FIG. 19 is a circuit diagram of a semiconductor integrated circuit according to the second embodiment.

The second embodiment will be explained with reference to FIG. 19. FIG. 19 is a circuit diagram showing a construction of a semiconductor integrated circuit. An embodiment of a semiconductor integrated circuit shown in FIG. 19 has a configuration that, in the fundamental construction of the semiconductor integrated circuit shown in FIG. 1, a gate of a third switching element 120 is connected to the output node 108 and the gate of the second switching element 104, and a plurality of switching elements are connected to the memory cell. It is possible that the third switching element 120 is used as a switch to change over the wiring in the FPGA in the same way as the second switching element 104, for example. In case that there are places where the conduction or non-conduction state of the switching elements become surely the same in the FPGA, it is possible to reduce the number of memory cells and to reduce the area by using the third switching element 120 without increasing the memory cell.

As another utilization method, it is also possible to use the third switching element 120 to confirm the states of the first resistive-change element 101 and the second resistive-change element 102. At the time of programming, for example, as there is a time when the two of the first resistive-change element 101 and the second resistive-change element 102 become both in the low resistance state, and a larger current flows than in the steady state, it is possible to judge whether or not the writing is performed by measuring a current flowing between the first power source 105 and the second power source 106. However, with respect to the two of the first resistive-change element 101 and the second resistive-change element 102 in the steady state, if the resistance state of one memory cell is in the high resistance state, the resistance state of the other memory is in the low resistance state in any of the state 1 or the state 2, so that it is impossible to judge in which state the resistive-change elements are by only reading the current amount. In addition, even in case that some sort of error occurs and to program is not made properly, it is not possible to judge only by the current amount. The state of the memory can be confirmed by the conduction or non-conduction state of the second switching element 104 by a signal flowing between a source and a drain. However as a source drain is used as a signal line of the FPGA, an increase in wiring capacity is generated and a time when the FPGA can not be operated occurs by adding and operating a circuit for confirmation use, and as a result, a trouble occurs in the actual circuit operation.

By flowing a test signal between the source and drain of the third switching element 120 and by confirming the conduction or non-conduction state of the third switching element 120, it is possible to analogize the conduction or non-conduction state of the second switching element 104 connected in the same way and the states of the first resistive-change element 101 and the second resistive-change element 102. As the source •drain of the third switching element 120 is used as a wiring for test use disconnectedly from the signal line of the FPGA, there is a merit that load is not given to the FPGA operation. In addition, though it is necessary for the second switching element 104 to take a large size so as to reduce the signal delay in an optional circuit construction, as the third switching element 120 can read only the test signal it is enough that third switching element 120 is a small size, and an overhead of the area can be suppressed to be small. In addition, N channel or P channel is good. Accordingly, the third switching element 120 can be used in all the above-described embodiments.

Figure 20:
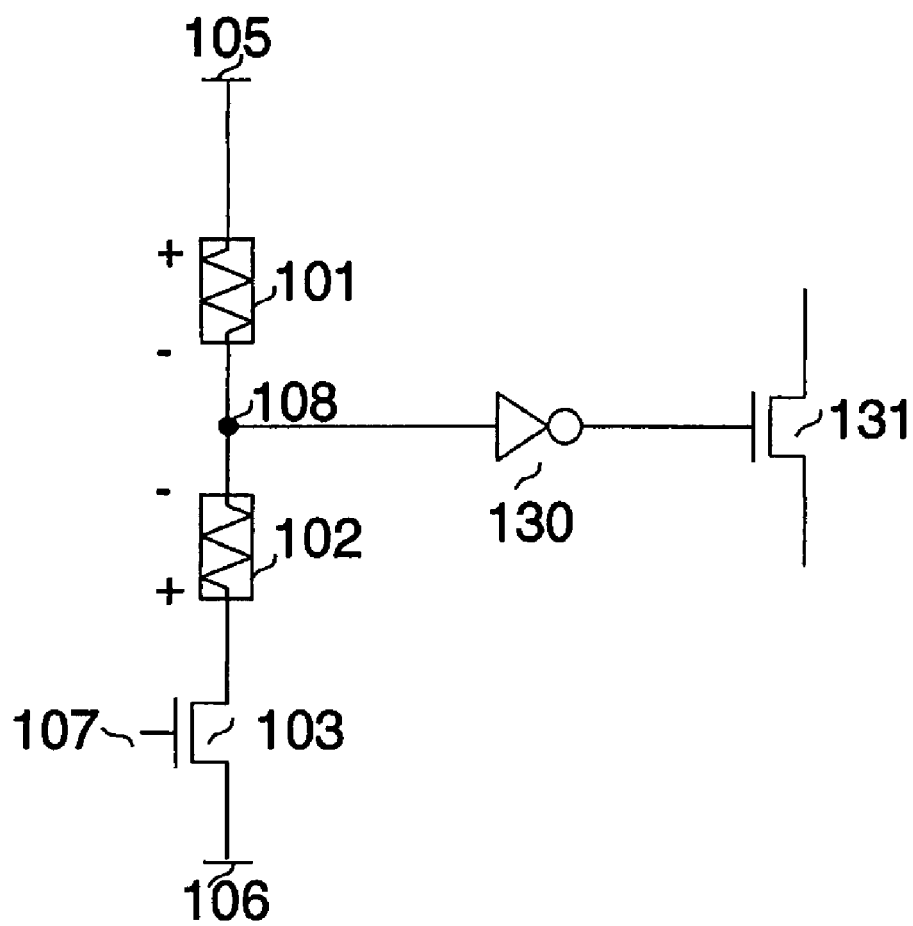
FIG. 20 is a circuit diagram of a semiconductor integrated circuit according to the third embodiment.

The third embodiment will be explained with reference to FIG. 20. FIG. 20 is a circuit diagram showing a semiconductor integrated circuit. FIG. 20 is one of modifications of the fundamental construction shown in FIG. 1. The construction of the first resistive-change element 101, the second resistive-change element 102 and the first switching element 103 is the same, the output node 108 between the two resistive-change elements is connected to a first inverting circuit 130. An output of the first inverting circuit 130 is connected to a gate of a fourth switching element 131. As a driving force may happen to drop depending on the resistance values of the first resistive-change element 101 and the second resistive-change element 102, the first inverting circuit 130 is inserted as a buffer so as to change over the conduction and non-conduction of the fourth switching element 131. In addition, in this case, the semiconductor integrated circuit is programmed so that the logic of the output node 108 is inverted. That is, the first resistive-change element 101 and the second resistive-change element 102 are programmed so that the output node 108 becomes a voltage near the lower voltage source voltage $V_{SS}$ in the case of making the fourth switching element 131 conducting and the output node 108 becomes a voltage near the higher voltage source voltage $V_{DD}$ in the case of making the fourth switching element 131 non-conducting.

Figure 21:
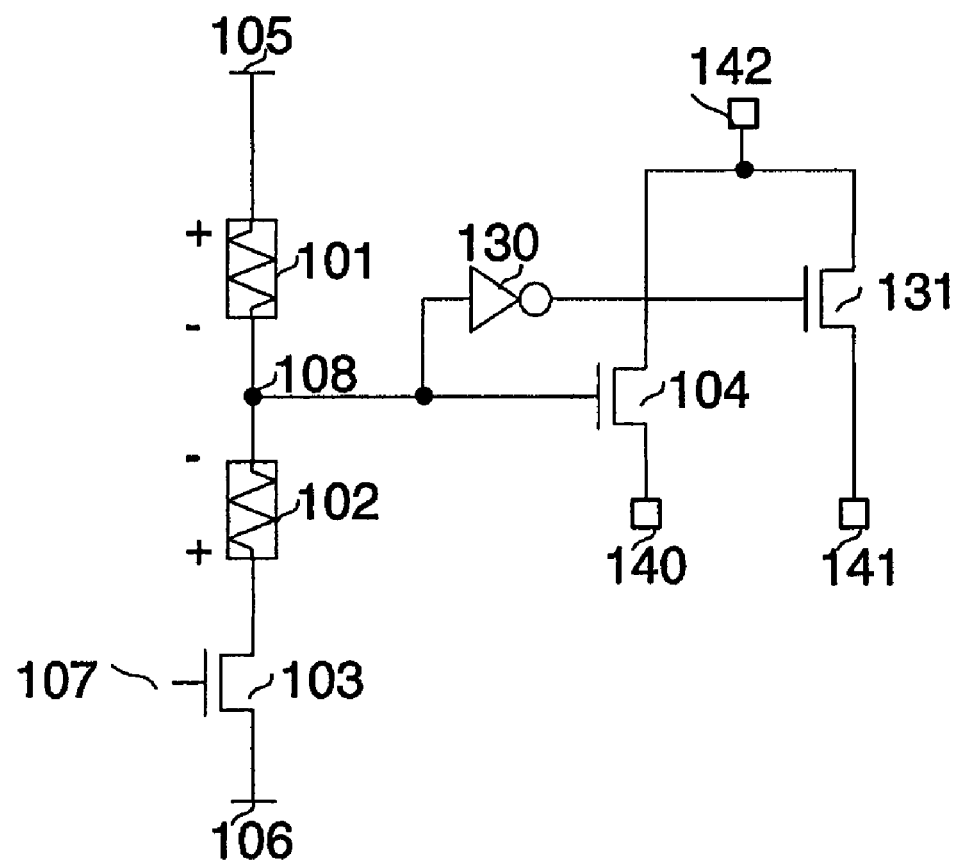
FIG. 21 is a circuit diagram of a semiconductor integrated circuit according to the fourth embodiment.

The fourth embodiment will be explained with reference to FIG. 21. FIG. 21 is a circuit diagram showing a semiconductor integrated circuit. FIG. 21 is an embodiment to realize a multiplexer with the fundamental construction of the semiconductor integrated circuit shown in FIG. 1. The construction of the first resistive-change element 101, the second resistive-change element 102 and the first switching element 103 is the same, the output node 108 between the two resistive-change elements is connected to the gate of the second switching element 104 and the first inverting circuit 130. The output of the first inverting circuit 130 is connected to the gate of the fourth switching element 131. A first input terminal 140 is connected to a source of the second switching element 104, and a second input terminal 141 is connected to a source of the fourth switching element 131, and both drains of the second switching element 104 and the fourth switching element 131 are connected to an output terminal 142. At the time of the FPGA operation, in case that the output node 108 is a voltage near the higher voltage source voltage $V_{DD}$, for example, as the second switching element 104 is ON and the fourth switching element 131 becomes OFF, the state of the first input terminal 140 is outputted to the output terminal 142. Conversely, in case that the output node 108 is a voltage near the lower voltage source voltage $V_{SS}$, as the second switching element 104 is OFF and the fourth switching element 131 becomes ON, the state of the second input terminal 141 is outputted to the output terminal 142. As this, in case that to realize the complementary logic is wanted, this is dealt with by adding an inverting circuit to one of the two inputs. In addition, an example of a multiplexer with 2 inputs, 1 output is shown here, it is possible to realize a multiplexer with the optional number of inputs by repeating this.

Figure 22:
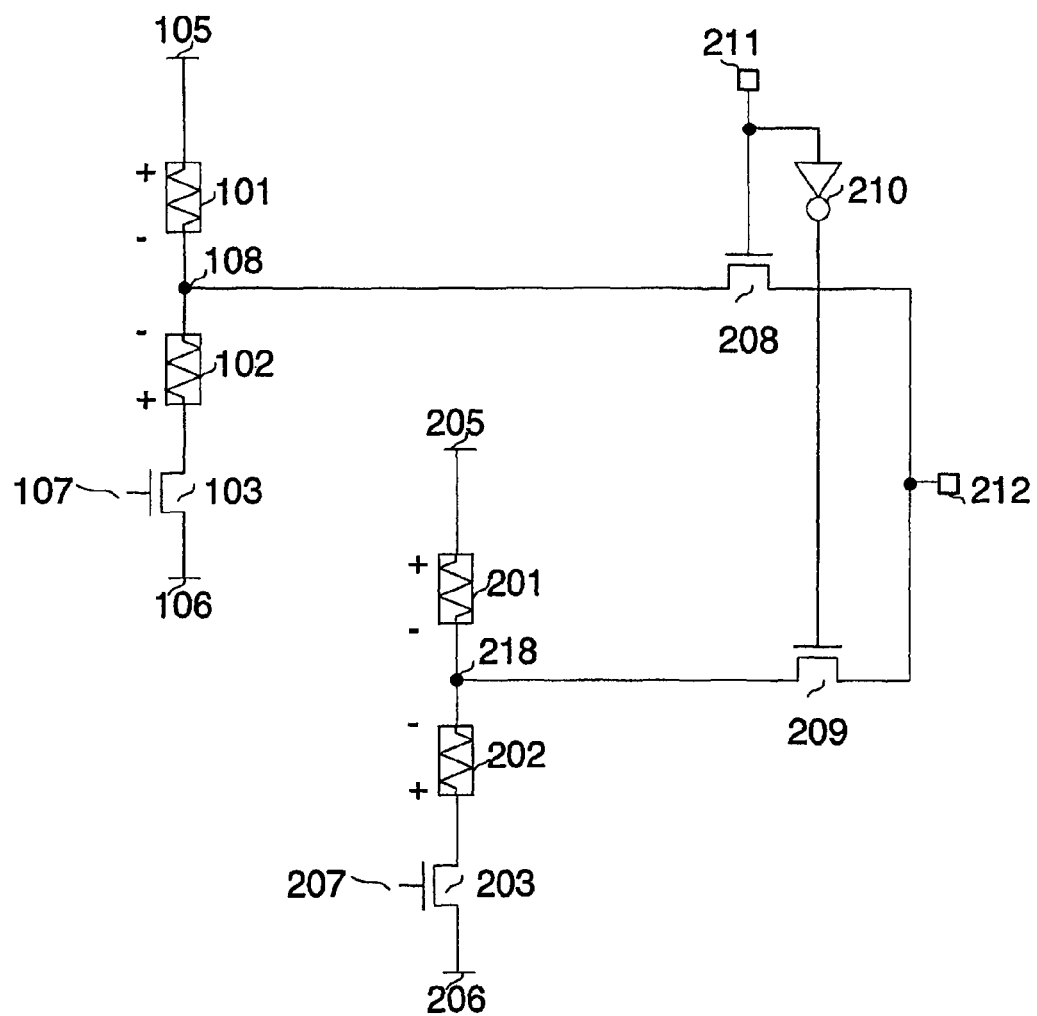
FIG. 22 is a circuit diagram of a semiconductor integrated circuit according to the fifth embodiment.

The fifth embodiment will be explained with reference to FIG. 22. FIG. 22 is a circuit diagram showing a semiconductor integrated circuit. FIG. 22 is an embodiment to realize a look-up table. The construction of the first resistive-change element 101, the second resistive-change element 102 and the first switching element 103 and the construction of a third resistive-change element 201, a fourth resistive-change element 202 and a sixth switching element 203 are the same, the output node 108 and an output node 218 between the resistive-change elements are respectively connected to sources of a fifth switching element 208 and a seventh switching element 209. An input terminal 211 is connected to a gate of the fifth switching element 208 and a second inverting circuit 210, and an output side of the second inverting circuit 210 is connected to a gate of the seventh switching element 209. Drains of the fifth switching element 208 and the seventh switching element 209 are both connected to an output terminal 212. At the time of the FPGA operation, in case that the higher voltage source voltage $V_{DD}$ is inputted to the input terminal 211, for example, as the fifth switching element 208 becomes ON and the seventh switching element 209 becomes OFF, a value of the output node 108 decided by the states of the first resistive-change element 101 and the second resistive-change element 102 is outputted to the output terminal 212. Conversely, in case that the lower voltage source voltage $V_{SS}$ is inputted to the input terminal 211, as the fifth switching element 208 becomes OFF and the seventh switching element 209 becomes ON, a value of the output node 218 decided by the states of the third resistive-change element 201 and the fourth resistive-change element 202 is outputted to the output terminal 212. By programming properly values of the first resistive-change element 101, the second resistive-change element 102, the third resistive-change element 201 and the fourth resistive-change element 202, an optional truth table with 1 input, 1 output can be realized. In addition, an example of a look-up table with 1 input, 1 output is shown here, it is possible to realize a look-up table with the optional number of inputs by repeating this.

Figure 23:
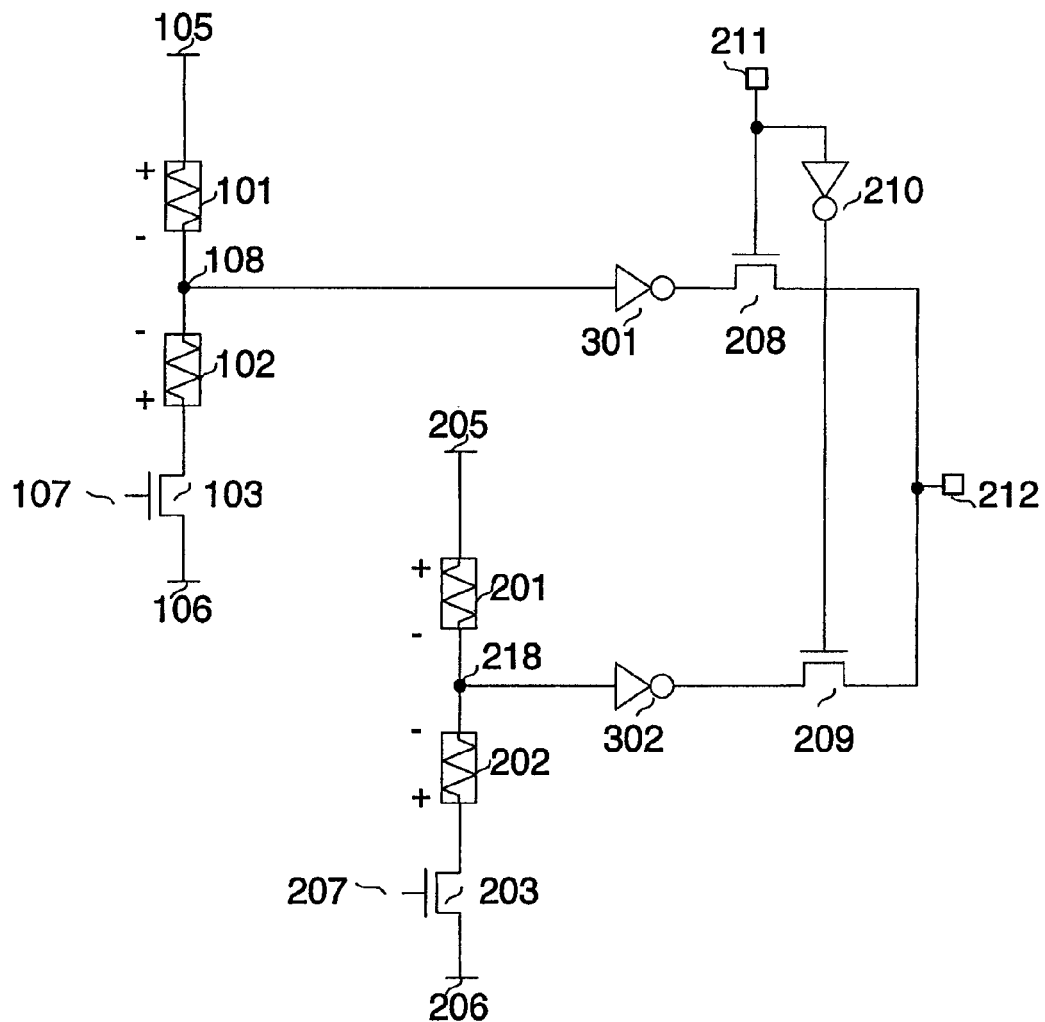
FIG. 23 is a circuit diagram of a semiconductor integrated circuit according to the sixth embodiment.

The sixth embodiment will be explained with reference to FIG. 23. FIG. 23 is a circuit diagram showing a semiconductor integrated circuit. FIG. 23 is one of the modifications of FIG. 22 which realizes a look-up table. The construction of the first resistive-change element 101, the second resistive-change element 102 and the first switching element 103 and the construction of the third resistive-change element 201, the fourth resistive-change element 202 and the sixth switching element 203 are the same, the output node 108 and the output node 218 are respectively connected to a third inverting circuit 301 and a fourth inverting circuit 302. An output side of the third inverting circuit 301 is connected to the source of the fifth switching element 208 and an output side of the fourth inverting circuit 302 is connected to the source of the seventh switching element 209. The input terminal 211 is connected to the gate of the fifth switching element 208 and the second inverting circuit 210, an output side of the second inverting circuit 210 is connected to the gate of the seventh switching circuit 209. The drains of the fifth switching element 208 and the seventh switching element 209 are both connected to the output terminal 212. As driving forces may happen to drop depending on the resistance values of the first resistive-change element 101 and the second resistive-change element 102, and the resistance values of the third resistive-change element 201 and the fourth resistive-change element 202, the third inverting circuit 301 and the fourth inverting circuit 302 are inserted as buffers, respectively, and are used for the output of the look-up table. At the time of the FPGA operation, in case that the higher voltage source voltage $V_{DD}$ is inputted to the input terminal 211, for example, as the fifth switching element 208 becomes ON and the seventh switching element 209 becomes OFF, an inverted value of the output node 108 decided by the states of the first resistive-change element 101 and the second resistive-change element 102 is outputted to the output terminal 212. Conversely, in case that the lower voltage source voltage $V_{SS}$ is inputted to the input terminal 211, as the fifth switching element 208 becomes OFF and the seventh switching element 209 becomes ON, an inverted value of the output node 218 decided by the states of the third resistive-change element 201 and the fourth resistive-change element 202 is outputted to the output terminal 212. By programming properly values of the first resistive-change element 101, the second resistive-change element 102, the third resistive-change element 201 and the fourth resistive-change element 202, an optional truth table with 1 input, 1 output can be realized. As the third inverting circuit 301 and the fourth inverting circuit 302 are inserted as the buffers, the values of the output nodes 108, 208 are made so as to become reverse numbers in the case of programming the memory device.

Hereinbefore, in the embodiment, it is possible to apply a resistive-change bipolar type memory to an FPGA without causing false writing or false operation. The embodiments described above are shown as one example, and it is possible to use a construction combined with the embodiments or a different construction having the similar function.

While certain embodiments have been described, the embodiments have been presented by way of example only, and are not intended to limit the scope of the inventions. Indeed, the semiconductor integrated circuits described herein may be embodied in a variety of other forms; furthermore, various omissions, substitutions and changes in the form of the semiconductor integrated circuits described herein may be made without departing from the spirit of the inventions. The accompanying claims and their equivalents are intended to cover such forms or modifications as would fall within the scope and spirit of the inventions.

What is claimed is:

1. A semiconductor integrated circuit, comprising:
a first resistive-change element including one end having a first polarity connected to a first power source, the first resistive-change element including another end having a second polarity connected to a first output node;
a second resistive-change element including one end having the second polarity connected to the first output node;
a first switching element including a first terminal connected to another end of the second resistive-change element, the first switching element including a second terminal connected to a second power source;
a fifth switching element including a first terminal connected to the first output node, the fifth switching element including a second terminal connected to an output terminal;
a third resistive-change element including one end having the first polarity connected to a third power source, the third resistive-change element including another end having the second polarity connected to a second output node;
a fourth resistive-change element including one end having a second polarity connected to the second output node;

a sixth switching element including a first terminal connected to another end of the fourth resistive-change element, the sixth switching element including a second terminal connected to a fourth power source;
a seventh switching element including a first terminal connected to the second output node, the seventh switching element including a second terminal connected to the output terminal; and
a second inverting circuit connected to a control terminal of the fifth switching element and a control terminal of the seventh switching element.

2. The semiconductor integrated circuit according to claim 1, further comprising:
a third inverting circuit connected to the first output node and a first terminal of the fifth switching element; and
a fourth inverting circuit connected to the second output node and a first terminal of the seventh switching element.

3. The semiconductor integrated circuit according to claim 1, wherein, assuming that a resistance of the resistive-change element in a high resistance state is $R_{off}$, a resistance of the resistive-change element in a low resistance state is $R_{on}$ and a sub threshold factor is S, the threshold voltage of the first and sixth switching elements is larger than the value shown by the following expression $$S \cdot \log_{10} \frac{R_{off}}{R_{on}}.$$

4. The semiconductor integrated circuit according to claim 1, wherein the first to fourth resistive-change elements have upper and lower electrodes, and the area of the upper electrode is smaller than that of the lower electrode.

5. The semiconductor integrated circuit according to claim 1, wherein a look-up table (LUT) of 1-input, 1-output is possible to realize by programming the first to fourth resistive-change elements with a predetermined value.

6. The semiconductor integrated circuit according to claim 1, wherein a ratio of the resistance of the first to fourth resistive-change elements in a higher resistance state and the resistance of the first to fourth resistive-change elements in a lower resistance state is equal to or greater than 10.

7. The semiconductor integrated circuit according to claim 2, wherein a look-up table (LUT) of 1-input, 1-output is possible to realize by programming the first to fourth resistive-change elements with a predetermined value.

8. A semiconductor integrated circuit, comprising:
a first resistive-change element including a first end having a first polarity connected to a first power source, the first resistive-change element including a second end having a second polarity connected to an output node;
a second resistive-change element including a first end having the second polarity connected to the output node, and a second end; and
a first switching element including a first terminal connected to the second end of the second resistive-change element, the first switching element including a second terminal connected to a second power source,
wherein, in the case where a resistance of the resistive-change element in a high resistance state is $R_{off}$, a resistance of the resistive-change element in a low resistance state is $R_{on}$ and a sub threshold factor is S, the threshold voltage of the first switching element is larger than the value shown by the following expression $$S \cdot \log_{10} \frac{R_{off}}{R_{on}}.$$

9. The semiconductor integrated circuit according to claim 8, further comprising:
a second switching element including a control terminal connected to the output node.

10. The semiconductor integrated circuit according to claim 8, wherein the first and second resistive-change elements have upper and lower electrodes, and an area of the upper electrode is smaller than an area of the lower electrode in the first and second resistive-change elements.

11. The semiconductor integrated circuit according to claim 8,
wherein the first switching element is an N channel IGFET, and
wherein the first power source is supplied with a first voltage source voltage, and the second power source is supplied with a second voltage source voltage lower than the first voltage source voltage, respectively, when the semiconductor integrated circuit operates.

12. The semiconductor integrated circuit according to claim 8,
wherein the first switching element is a P channel IGFET, and
wherein the first power source is supplied with a first voltage source voltage, and the second power source is supplied with a second voltage source voltage higher than the first voltage source voltage when the semiconductor integrated circuit operates.

13. The semiconductor integrated circuit according to claim 8, wherein a ratio of the resistance of the first and second resistive-change elements in a first resistance state and the resistance of the first and second resistive-change elements in a second resistance state lower than the first resistance state is equal to or greater than 10.

14. The semiconductor integrated circuit according to claim 8, wherein a write voltage to be applied to the first and second resistive-change elements is higher than a write voltage to be applied to a resistive-change elements as a memory unit.

15. The semiconductor integrated circuit according to claim 9, further comprising:
a third switching element including a control terminal connected to the output node.

16. The semiconductor integrated circuit according to claim 9, further comprising:
a fourth switching element including a control terminal connected to the output node via a first inverting circuit.

17. The semiconductor integrated circuit according to claim 9,
wherein the second switching element is an N channel IGFET, and
wherein the second switching element turns on when the first and second resistive-change elements are written by setting the first power source to a first potential and by setting the second power source to a second potential lower than the first potential.

18. The semiconductor integrated circuit according to claim 16, further comprising:
an output terminal connected to a first terminal of the second switching element and a first terminal of the fourth switching element.

* * * * *